(12) United States Patent
Ching et al.

(10) Patent No.: US 11,355,611 B2
(45) Date of Patent: Jun. 7, 2022

(54) MULTI-GATE DEVICE AND METHOD OF FABRICATION THEREOF

(71) Applicant: Taiwan Semiconductor Manufacturing Company, Ltd., Hsinchu (TW)

(72) Inventors: Kuo-Cheng Ching, Hsinchu County (TW); Ching-Fang Huang, Taipei (TW); Wen-Hsing Hsieh, Hsinchu (TW); Ying-Keung Leung, Hsinchu (TW); Chih-Hao Wang, Hsinchu (TW); Carlos H. Diaz, Los Altos Hills, CA (US)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 64 days.

(21) Appl. No.: 17/073,013

(22) Filed: Oct. 16, 2020

(65) Prior Publication Data

US 2021/0050427 A1    Feb. 18, 2021

Related U.S. Application Data

(60) Division of application No. 15/882,379, filed on Jan. 29, 2018, now Pat. No. 10,811,509, which is a continuation of application No. 14/954,823, filed on Nov. 30, 2015, now Pat. No. 9,887,269.

(51) Int. Cl.
| | | |
|---|---|---|
| *H01L 21/3205* | (2006.01) | |
| *H01L 21/84* | (2006.01) | |
| *H01L 29/66* | (2006.01) | |
| *H01L 29/78* | (2006.01) | |
| *H01L 29/786* | (2006.01) | |
| *H01L 29/423* | (2006.01) | |
| *H01L 29/06* | (2006.01) | |
| *H01L 29/417* | (2006.01) | |

(52) U.S. Cl.
CPC .. *H01L 29/42392* (2013.01); *H01L 21/32053* (2013.01); *H01L 21/845* (2013.01); *H01L 29/0673* (2013.01); *H01L 29/41791* (2013.01); *H01L 29/66545* (2013.01); *H01L 29/785* (2013.01); *H01L 29/78696* (2013.01); *H01L 29/665* (2013.01)

(58) Field of Classification Search
CPC ............. H01L 21/32053; H01L 29/66545
See application file for complete search history.

(56) References Cited

U.S. PATENT DOCUMENTS

| | | |
|---|---|---|
| 7,425,740 B2 | 9/2008 | Liu et al. |
| 8,048,723 B2 | 11/2011 | Chang et al. |
| 8,053,299 B2 | 11/2011 | Xu |
| 8,183,627 B2 | 5/2012 | Currie |

(Continued)

*Primary Examiner* — Moazzam Hossain
(74) *Attorney, Agent, or Firm* — Haynes and Boone, LLP

(57) ABSTRACT

A semiconductor device includes a source/drain feature disposed over a substrate. The source/drain feature includes a first nanowire, a second nanowire disposed over the first nanowire, a cladding layer disposed over the first nanowire and the second nanowire and a spacer layer extending from the first nanowire to the second nanowire. The device also includes a conductive feature disposed directly on the source/drain feature such that the conductive feature physically contacts the cladding layer and the spacer layer.

20 Claims, 43 Drawing Sheets

(56) References Cited

U.S. PATENT DOCUMENTS

| | | |
|---|---|---|
| 8,415,718 B2 | 4/2013 | Xu |
| 8,497,177 B1 | 7/2013 | Chang et al. |
| 8,609,518 B2 | 12/2013 | Wann et al. |
| 8,618,556 B2 | 12/2013 | Wu et al. |
| 8,633,516 B1 | 1/2014 | Wu et al. |
| 8,703,565 B2 | 4/2014 | Chang et al. |
| 8,742,509 B2 | 6/2014 | Lee et al. |
| 8,776,734 B1 | 7/2014 | Roy et al. |
| 8,785,285 B2 | 7/2014 | Tsai et al. |
| 8,796,666 B1 | 8/2014 | Huang et al. |
| 8,815,712 B2 | 8/2014 | Wan et al. |
| 2010/0295021 A1 | 11/2010 | Chang et al. |
| 2010/0295022 A1 | 11/2010 | Chang et al. |
| 2011/0031473 A1 | 2/2011 | Chang et al. |
| 2013/0270512 A1 | 10/2013 | Radosavljevic |
| 2013/0285153 A1 | 10/2013 | Lee et al. |
| 2013/0313513 A1 | 11/2013 | Cappellani et al. |
| 2014/0042386 A1 | 2/2014 | Cea et al. |
| 2014/0183600 A1 | 7/2014 | Huang et al. |
| 2014/0197377 A1 | 7/2014 | Kim |
| 2014/0252489 A1* | 9/2014 | Yu .................. H01L 29/66477 438/285 |
| 2014/0264590 A1 | 9/2014 | Yu et al. |
| 2014/0264592 A1 | 9/2014 | Oxland et al. |
| 2015/0194489 A1 | 7/2015 | Barroud et al. |
| 2015/0364603 A1 | 12/2015 | Cheng |
| 2016/0064527 A1* | 3/2016 | Basker ................ H01L 29/161 257/288 |
| 2017/0040321 A1 | 2/2017 | Mitard |
| 2017/0125541 A1* | 5/2017 | Pranatharthiharan ........................ H01L 29/511 |
| 2017/0154973 A1 | 6/2017 | Ching et al. |
| 2018/0240874 A1 | 8/2018 | Weber |

* cited by examiner

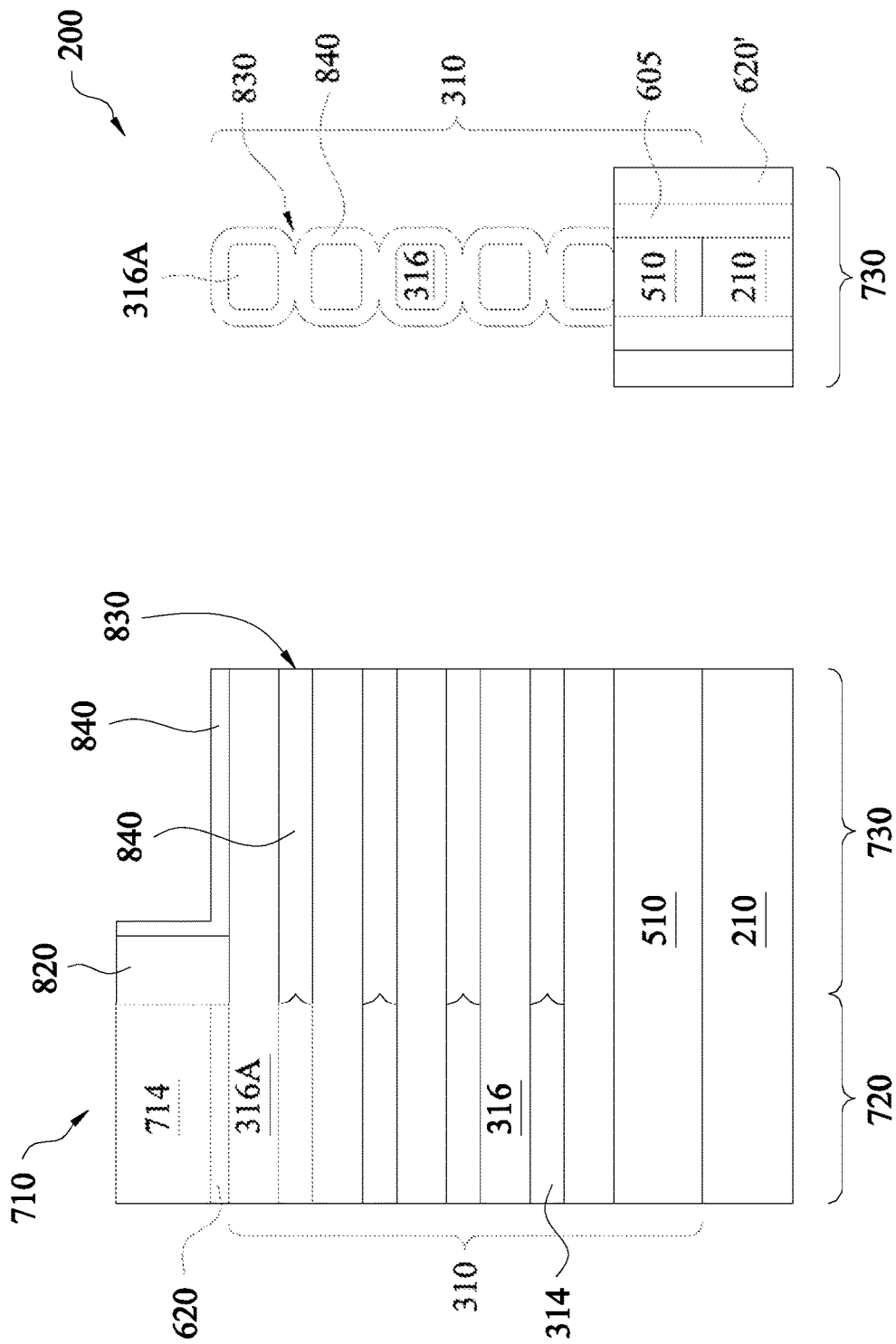

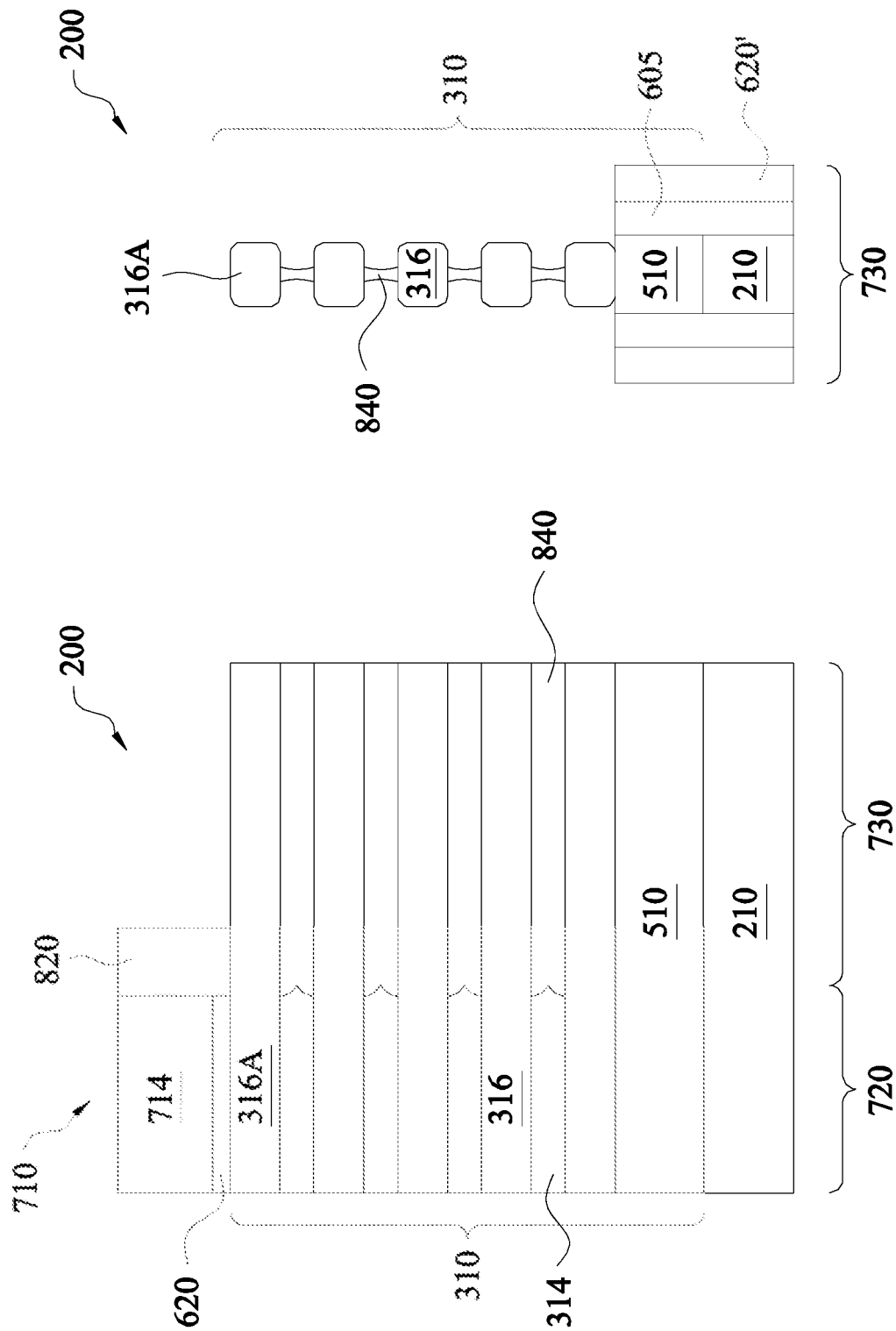

MULTI-GATE DEVICE AND METHOD OF FABRICATION THEREOF

PRIORITY DATA

This application is a divisional application of U.S. patent application Ser. No. 15/882,379, filed Jan. 29, 2018, which is a continuation application of U.S. patent application Ser. No. 14/954,823, filed Nov. 30, 2015, now issued as U.S. Pat. No. 9,887,269, each of which is herein incorporated by reference in its entirety.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled while maintaining gate control and mitigating SCEs. In conventional processes, GAA devices provide a channel in a silicon nanowire. However, integration of fabrication of the GAA features around the nanowire can be challenging. For example, while the current methods have been satisfactory in many respects, continued improvements are still needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13B is a cross-section view, corresponding to the isometric view of FIG. 13A along line A-A, of an embodiment of the device 200 according to aspects of the method of FIG. 1.

FIG. 13C is a cross-section view, corresponding to the isometric view of FIG. 13A along line B-B, of an embodiment of the device 200 according to aspects of the method of FIG. 1.

FIGS. 14B and 14D are cross-section views, corresponding to the isometric view of FIG. 14A along line A-A, of an embodiment of the device 200 according to aspects of the method of FIG. 1.

FIGS. 14C and 14E are cross-section views, corresponding to the isometric view of FIG. 14A along line B-B, of an embodiment of the device 200 according to aspects of the method of FIG. 1.

DETAILED DESCRIPTION

Figure 1:
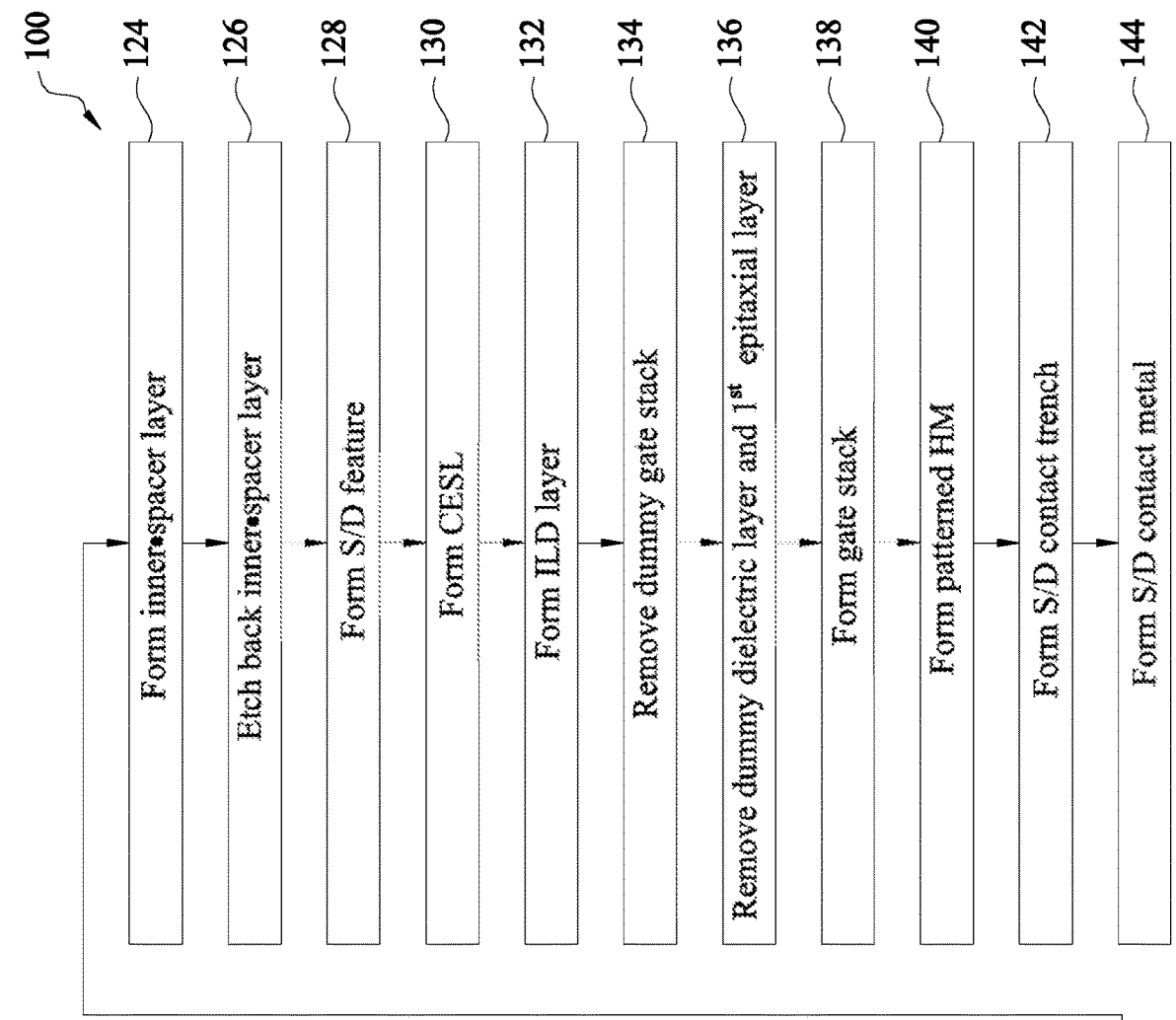
FIG. 1 is a flow chart of a method of fabricating a multi-gate device or portion provided according to one or more aspects of the present disclosure and including an isolation region under the gate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FINFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanowire channel(s), bar-shaped channel(s), and/or other suitable channel configuration. Presented herein are embodiments of devices that may have one or more channel regions (e.g., nanowires) associated with a single, contiguous gate structure. However, one of ordinary skill would recognize that the teachings described herein apply to a single channel (e.g., single nanowire) or any number of channels.

FIG. 1 is a method 100 of semiconductor fabrication including fabrication of multi-gate devices. A multi-gate device refers to a device (e.g., a semiconductor transistor) that has at least some gate material disposed on multiple sides of at least one channel of the device. In some examples, the multi-gate device may be referred to as a GAA device having gate material disposed on at least four sides of at least one channel of the device. The channel region may be referred to as a "nanowire," which includes channel regions of various geometries (e.g., cylindrical, bar-shaped) and various dimensions.

FIGS. 2-11, 12A-14A, 15-22, 23A and 23B are isometric views of an embodiment of a semiconductor device 200 according to various stages of method 100 of FIG. 1. FIGS. 12B-12C, 13B-13C, 14B-14E and 23C-23H are cross-sectional views, corresponding to the respective isometric views listed above, of an embodiment of the semiconductor device 200 according to various stages of method 100 of FIG. 1. As with the other method embodiments and exemplary devices discussed herein, it is understood that parts of the semiconductor device 200 may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including PFETs, NFETs, etc., which may be interconnected.

Figure 2:
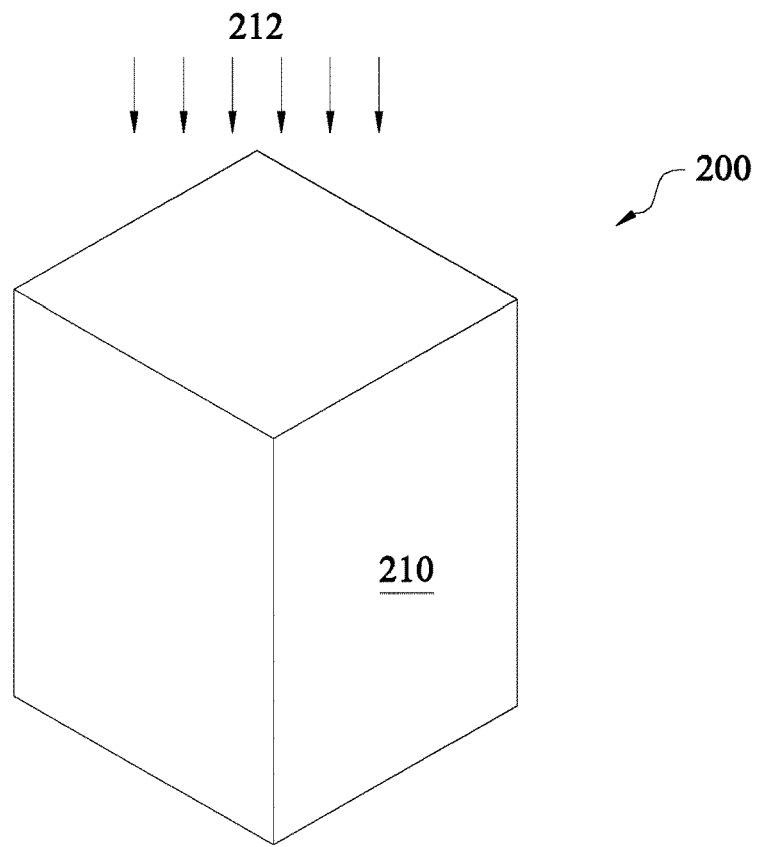
FIGS. 2, 3, 4, 5, 6, 7, 8, 9, 10, 11 and 12A are isometric views of an embodiment of a device 200 according to aspects of the method of FIG. 1.

Referring to FIGS. 1 and 2, method 100 begins at step 102 by applying an anti-punch through (APT) implant 212 to a substrate 210. In some embodiments, the substrate 210 may be a semiconductor substrate such as a silicon substrate. The substrate 210 may include various layers, including conductive or insulating layers formed on a semiconductor substrate. The substrate 210 may include various doping configurations depending on design requirements as is known in the art. For example, different doping profiles (e.g., n wells, p wells) may be formed on the substrate 210 in regions designed for different device types (e.g., n-type field effect transistors (NFET), p-type field effect transistors (PFET)). The suitable doping may include ion implantation of dopants and/or diffusion processes. The substrate 210 typically has isolation features (e.g., shallow trench isolation (STI) features) interposing the regions providing different device types. The substrate 210 may also include other semiconductors such as germanium, silicon carbide (SiC), silicon germanium (SiGe), or diamond. Alternatively, the substrate 210 may include a compound semiconductor and/or an alloy semiconductor. Further, the substrate 210 may optionally include an epitaxial layer (epi-layer), may be strained for performance enhancement, may include a silicon-on-insulator (SOI) structure, and/or have other suitable enhancement features.

The APT implant 212 may be performed in a region underlying the channel region of a device for example, to prevent punch-through or unwanted diffusion. In some embodiments, a first photolithography (photo) step is performed to pattern a P-type APT region and a second photo step is performed to pattern an N-type APT region. For example, in some embodiments, performing the first photo step may include forming a photoresist layer (resist) over the substrate 210, exposing the resist to a pattern (e.g., P-type APT implant mask), performing post-exposure bake processes, and developing the resist to form a patterned resist layer. By way of example, a P-type dopant implanted via the ion implantation process to form the P-type APT region may include boron, aluminum, gallium, indium, and/or other P-type acceptor material. Thereafter, in some embodiments, the second photo step may be performed, where the second photo step may include forming a resist layer over the substrate 210, exposing the resist to a pattern (e.g., N-type APT implant mask), performing post-exposure bake processes, and developing the resist to form a patterned resist layer. By way of example, an N-type dopant implanted via the ion implantation process into the N-type APT region may include arsenic, phosphorous, antimony, or other N-type donor material. Additionally, in various embodiments, an APT implant may have a high dopant concentration, for example, of between about $1\times10^{18}$ cm$^{-3}$ and $1\times10^{19}$ cm$^{-3}$. In some embodiments, such a high APT dopant concentration may be advantageously used, as described below, because of the presence of a subsequently formed isolation layer over the APT-implanted substrate, which can serve as a dopant diffusion barrier.

Figure 3:
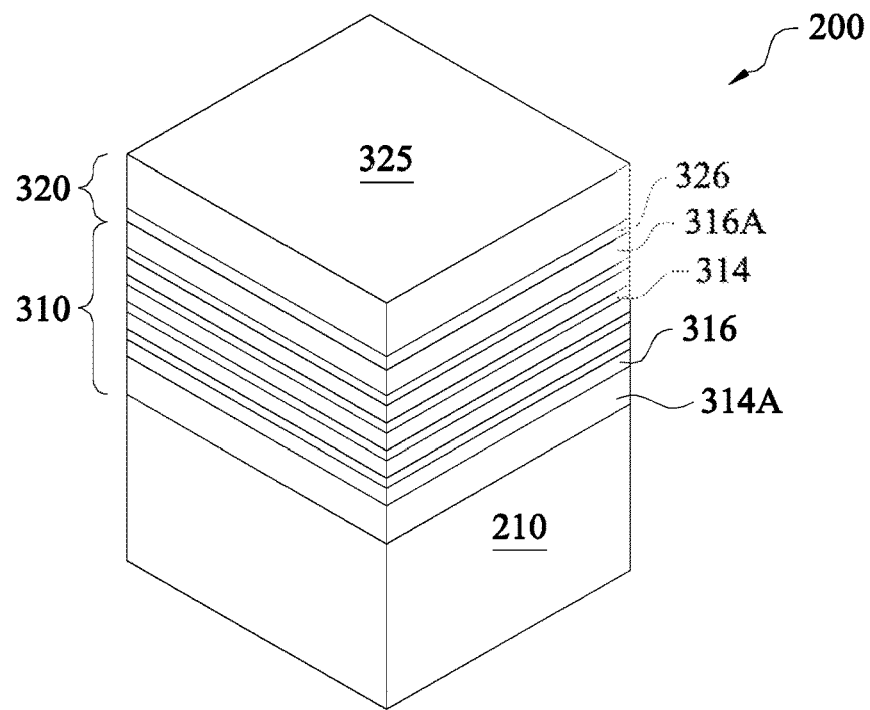

Referring to FIGS. 1 and 3, method 100 proceeds to step 104 by forming an epitaxial stack 310 over the APT-implanted substrate 210. The epitaxial stack 310 includes first epitaxial layers 314 of a first composition interposed by second epitaxial layers 316 of a second composition. The first and second composition may be different or may be the same. In an embodiment, the first epitaxial layers 314 are formed of SiGe and the second epitaxial layers 316 are formed of silicon. However, other embodiments are possible including those that provide for a first composition and a second composition having different oxidation rates. For example, in various embodiments, the first epitaxial layer 314 has a first oxidation rate, and the second epitaxial layer 316 has a second oxidation rate less than the first oxidation rate. In some embodiments, the first epitaxial layer 314 includes SiGe and where the second epitaxial layer 316 includes Si, The Si oxidation rate of the second epitaxial layer 316 is less than the SiGe oxidation rate of the first epitaxial layer 314. During a subsequent oxidation process, as discussed below, the portions the first epitaxial layer 314 may be fully oxidized, while the second epitaxial layer 316 may be non-oxidized, or in some embodiments oxidized only slightly (e.g., sidewalls).

It is noted that the bottom-most epitaxial layer is denoted 314A for ease of reference in later process steps. In embodiments however, the epitaxial layer 314A is substantially similar material to the first epitaxial layers 314. In an embodiment, the epitaxial layer 314A is SiGe and the first epitaxial layers 314 may also be SiGe. In other embodiments, the epitaxial layer 314A has a different composition than the first epitaxial layers 314 and/or second epitaxial layers 316. The thickness of the epitaxial layer 314A may be greater than that of the overlying first epitaxial layers 314.

It is also noted that the top-most epitaxial layer is denoted 316A for ease of reference in later process steps. In embodiments however, the epitaxial layer 316A is substantially similar material to the second epitaxial layers 316. In some embodiments, the thickness of the epitaxial layer 316A may be greater than that of the second epitaxial layers 316 to compensate thickness loss during subsequent etch processes. In one embodiment, the thickness of the epitaxial layer 316A is from 5 nm to 15 nm greater than the thickness of the second epitaxial layer 316.

The second epitaxial layers 316/316A or portions thereof may form a channel region of the multi-gate device 200. For example, the second epitaxial layers 316/316A may be referred to as "nanowires" used to form a channel region of a multi-gate device 200 such as a GAA device. These "nanowires" are also used to form a portion of the source/drain features of the multi-gate device 200 as discussed below. The "nanowires" includes semiconductor layers that are cylindrical in shape as well as other configurations such as, bar-shaped. The use of the second epitaxial layers 316/316A to define a channel or channels of a device are further discussed below.

It is noted that five (5) layers of each of first epitaxial layers 314 (including 314A) and the nanowires 316 (including 316A) are illustrated in FIG. 3, this is for illustrative purposes only and not intended to be limiting. It can be appreciated that any number of epitaxial layers can be formed in the epitaxial stack 310, the number of layers depending on the desired number of channels regions for the device 200. In some embodiments, the number of nanowires 316 (including 316A) is between 2 and 10.

In some embodiments, the first epitaxial layer 314 has a thickness range of about 2 nanometers (nm) to about 6 nm. The first epitaxial layers 314 may be substantially uniform in thickness. In some embodiments, the epitaxial layer 314A has a thickness of approximately 8 to 15 nm while the first epitaxial layers 314 there above each have a thickness ranging from about 2 nm to about 6 nm. In some embodiments, the nanowire 316 has a thickness (diameter) ranging from about 6 nm to about 12 nm. In some embodiments, the nanowires 316/316A are substantially uniform in thickness. As described in more detail below, each of the nanowires 316/316A may serve as channel region(s) for a subsequently-formed multi-gate device and its thickness chosen based on device performance considerations. The first epitaxial layer 314/314A may serve to define a gap distance between adjacent channel region(s) for a subsequently-formed multi-gate device and its thickness chosen based on device performance considerations.

By way of example, epitaxial growth of the layers of the epitaxial stack 310 may be formed by a molecular beam epitaxy (MBE) process, a metalorganic chemical vapor deposition (MOCVD) process, and/or other suitable epitaxial growth processes. In some embodiments, the epitaxially grown layers such as, the nanowires 316/316A includes the same material as the substrate 210. In some embodiments, the first epitaxial layers, 314/314A and the nanowires 316/316A include a different material than the substrate 210. As stated above, in at least some examples, the first epitaxial layer 314/314A includes an epitaxially grown silicon germanium (SiGe) layer and the nanowire 316/316A includes epitaxially grown silicon (Si) layer. In some embodiments, the epitaxial layer 314A is also SiGe. Alternatively, in some embodiments, either of the first epitaxial layer 314/314A and nanowires 316/316A may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the first epitaxial layers 314/314A and nanowires 316/316A may be chosen based on providing differing oxidation, etch selectivity properties. In various embodiments, the first epitaxial layers 314/314A and nanowires 316/316A are substantially dopant-free (i.e., having an extrinsic dopant concentration from about 0 $cm^{-3}$ to about $1\times10^{17}$ $cm^{-3}$), where for example, no intentional doping is performed during the epitaxial growth process.

As also shown in the example of FIG. 3, a hard mask (HM) layer 320 may be formed over the epitaxial stack 310. In some embodiments, the HM layer 320 includes an oxide layer 326 (e.g., a pad oxide layer that may include $SiO_2$) and nitride layer 326 (e.g., a pad nitride layer that may include $Si_3N_4$) formed over the oxide layer 325. In some examples, the HM layer 320 includes thermally grown oxide, chemical vapor deposition (CVD)-deposited oxide, and/or atomic layer deposition (ALD)-deposited oxide. In some embodiments, the HM layer 320 includes a nitride layer deposited by CVD and/or other suitable technique. The HM layer 320 may be used to protect portions of the substrate 210 and/or epitaxial stack 310 and/or used to define a pattern (e.g., fin elements) as discussed below.

Figure 4:
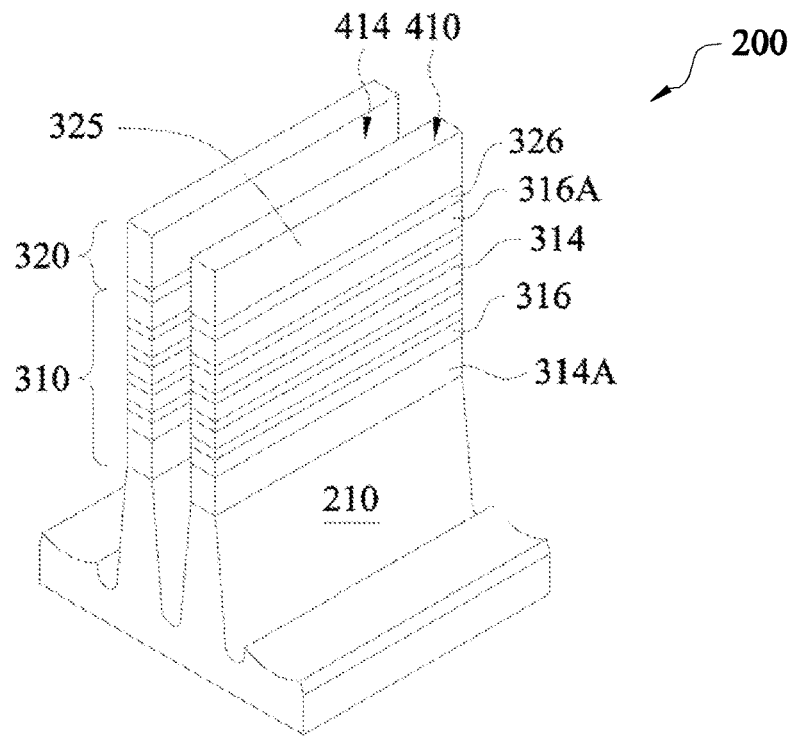

Referring to FIGS. 1 and 4, method 100 proceeds to step 106 by forming a plurality of fin elements 410 (referred to as fins) extending from the substrate 210. In various embodiments, each of the fins 410 includes a substrate portion formed from the substrate 210, portions of each of the epitaxial layers of the epitaxial stack 310 including epitaxial layers 314/314A and 316/316A, and an HM layer portion from the HM layer 320.

The fins 410 may be fabricated using suitable processes including photolithography and etch processes. The photolithography process may include forming a photoresist layer over the substrate 210 (e.g., over the HM layer 320 of FIG. 3), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 210, and layers formed thereupon, while an etch process forms trenches 414 in unprotected regions through the HM layer 320, through the epitaxial stack 310, and into the substrate 210, thereby leaving the plurality of extending fins 410. The trenches 414 may be etched using a dry etch (e.g., reactive ion etching), a wet etch, and/or combination thereof.

Numerous other embodiments of methods to form the fins on the substrate may also be used including, for example, defining the fin region (e.g., by mask or isolation regions) and epitaxially growing the epitaxial stack 310 in the form of the fin 410. In some embodiments, forming the fins 410 may include a trim process to decrease the width of the fins 410. The trim process may include wet and/or dry etching processes.

Figure 5:
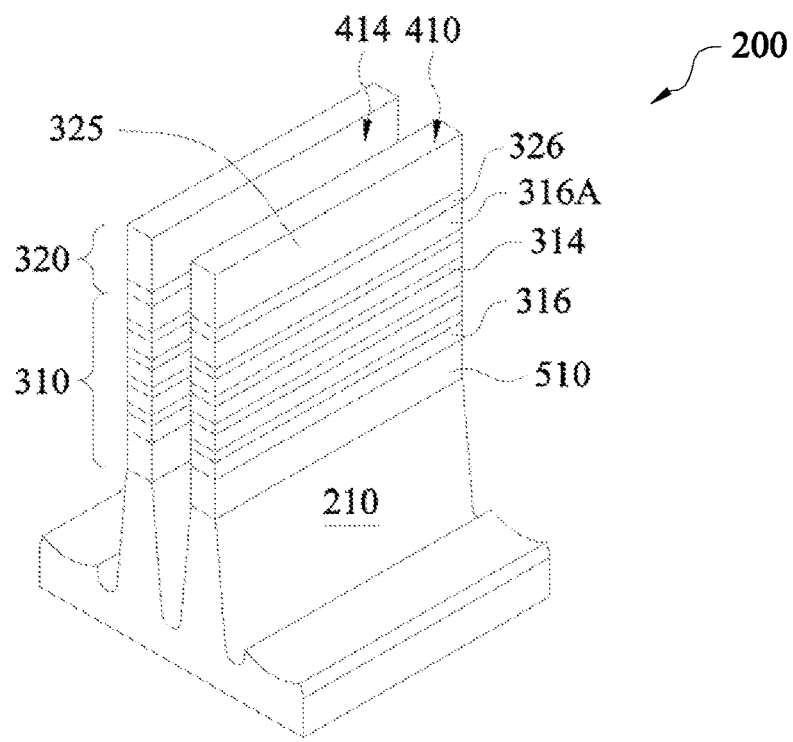

Referring to FIGS. 1 and 5, method 100 proceeds to step 108 by performing an oxidation process to form an isolation region within the fin element(s). The device 200 is exposed to an oxidation process that fully oxidizes the epitaxial layer portion 314A of each of the plurality of fins 410. The epitaxial layer portion 314A is transformed into an oxidized layer 510, which provides an isolation region/layer. In some embodiments, the oxidized layer 510 has a thickness range of about 5 to about 25 nanometers (nm). In an embodiment, the oxidized layer 510 may include an oxide of silicon germanium (SiGeOx).

The oxidation process may include forming and patterning various masking layers such that the oxidation is controlled to the epitaxial layer 314A. In other embodiments, the oxidation process is a selective oxidation due to the composition of epitaxial layer 314A. In some examples, the oxidation process may be performed by exposing the device 200 to a wet oxidation process, a dry oxidation process, and/or a combination thereof. In at least some embodiments, the device 200 is exposed to a wet oxidation process using water vapor or steam as the oxidant, at a pressure of about 1 ATM, within a temperature range of about 400° C. to about 600° C., and for a time from about 0.5 hours to about 2 hours. It is noted that the oxidation process conditions provided herein are merely exemplary, and are not meant to be limiting.

As described above, in some embodiments, the first epitaxial layer portion 314A may include a material having a first oxidation rate, and the second epitaxial layer 316/316A may include a material having a second oxidation rate less than the first oxidation rate. By way of example, in embodiments where the first epitaxial layer portion 314A includes SiGe, and where the second epitaxial layer portion 316/316A includes Si, the faster SiGe oxidation rate (i.e., as compared to Si) ensures that the SiGe layer (i.e., the epitaxial layer portion 314A) becomes fully oxidized while minimizing or eliminating the oxidization of other epitaxial layers 316/316A. It will be understood that any of the plurality of materials discussed above may be selected for each of the first and second epitaxial layer portions that provide different suitable oxidation rates.

The resultant oxidized layer 510 of each of the fins 410 can serve as a diffusion barrier to APT dopants previously implanted into the substrate 210, and which may be present in the substrate 210 directly below the oxidized layer 510. Thus, in various embodiments, the oxidized layer 510 prevents APT dopants within the substrate portion 210 from diffusing, for example, into the overlying nanowires 316/316A, which serves as a channel region for a subsequently formed multi-gate device. In some embodiments, the oxidized layer 510 is referred as isolation region 510. In other embodiments, the isolation region 510 is omitted.

Figure 6:
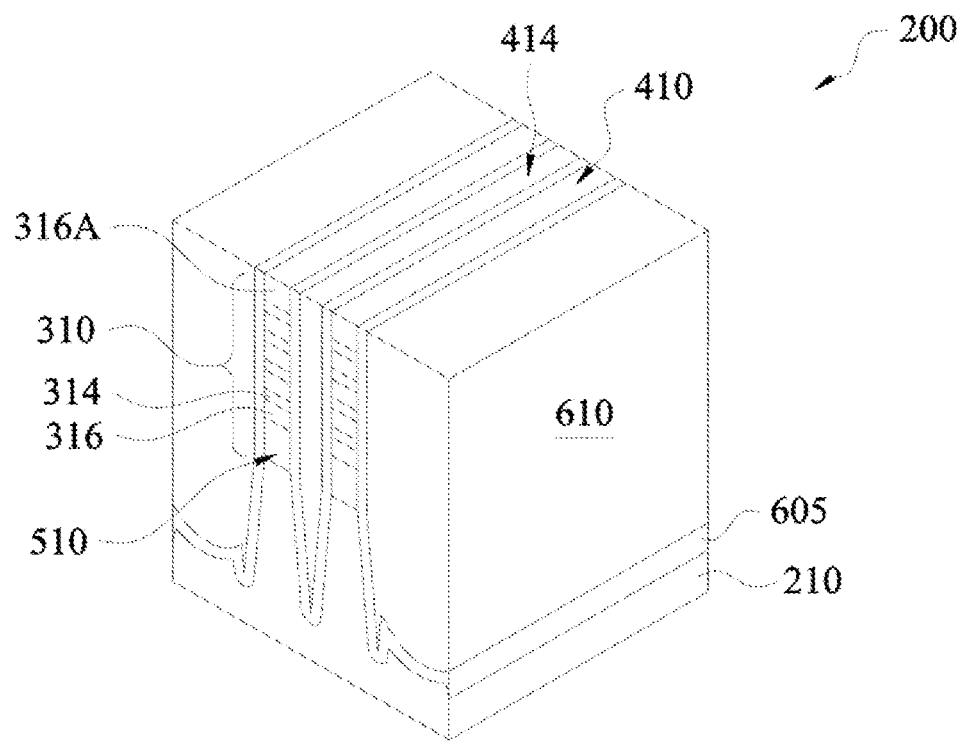

Referring to FIGS. 1 and 6, method 100 proceeds to step 110 by forming shallow trench isolation (STI) features 610 between the fins 410. By way of example, in some embodiments, a dielectric layer is first deposited over the substrate 210, filling the trenches 414 with the dielectric material. In some embodiments, the dielectric layer may include $SiO_2$, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. In some embodiments, after deposition of the dielectric layer, the device 200 may be annealed, for example, to improve the quality of the dielectric layer. In some embodiments, the dielectric layer (and subsequently formed STI features 610) may include a multi-layer structure, for example, having one or more liner layers.

In forming the STI features 610, after deposition of the dielectric layer, the deposited dielectric material is thinned and planarized, for example by a chemical mechanical polishing (CMP) process. The CMP process may planarize the top surface of the dielectric layer. In some embodiments, the CMP process used to planarize the top surface of the device 200 may also serve to remove the HM layer 320 from each of the plurality of fins 410. In some embodiments, a portion of the epitaxial layer 316A may be removed during removing the HM layer 320. As described above, the epitaxial layer 316A with a greater thickness may compensate thickness loss and relaxes process constrains. In some embodiments, removal of the HM layer 320 may alternately be performed by using a suitable etching process (e.g., dry or wet etching).

In some embodiments, prior to forming STI feature 610, a capping layer 605 is formed over fins 410 to protect fins 410 from oxidation during forming the STI feature 610. The capping layer 605 may include silicon nitride, silicon carbide, and/or other proper material. The capping layer 605 may be deposited by CVD, ALD, PVD, and/or other suitable process.

Figure 7:
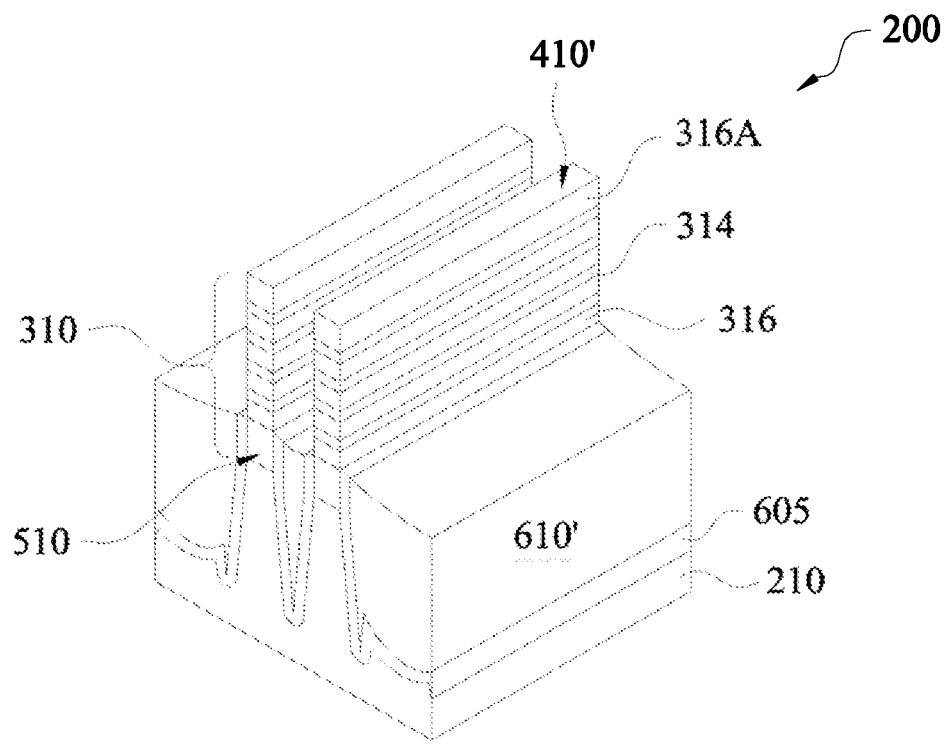

Referring to FIGS. 1 and 7, method 100 proceeds to step 112 by recessing the STI features 610, referred to as 610', interposing the fins 410 to provide the fins 410 extending above the recessed STI features 610'. In some embodiments, the recessing process may include a dry etching process, a wet etching process, and/or a combination thereof. In some embodiments, a recessing depth is controlled (e.g., by controlling an etching time) so as to result in a desired height of the exposed upper portion of the fins 410, referred to as 410'. The height exposes each of the layers of the epitaxy stack 310. While FIG. 7 illustrates the recess of the recessed STI feature 610' being substantially coplanar with a top surface of the isolation region 510. In other embodiments, recessed STI feature 610' may not be substantially coplanar with the top surface of the isolation region 510.

Figure 8:
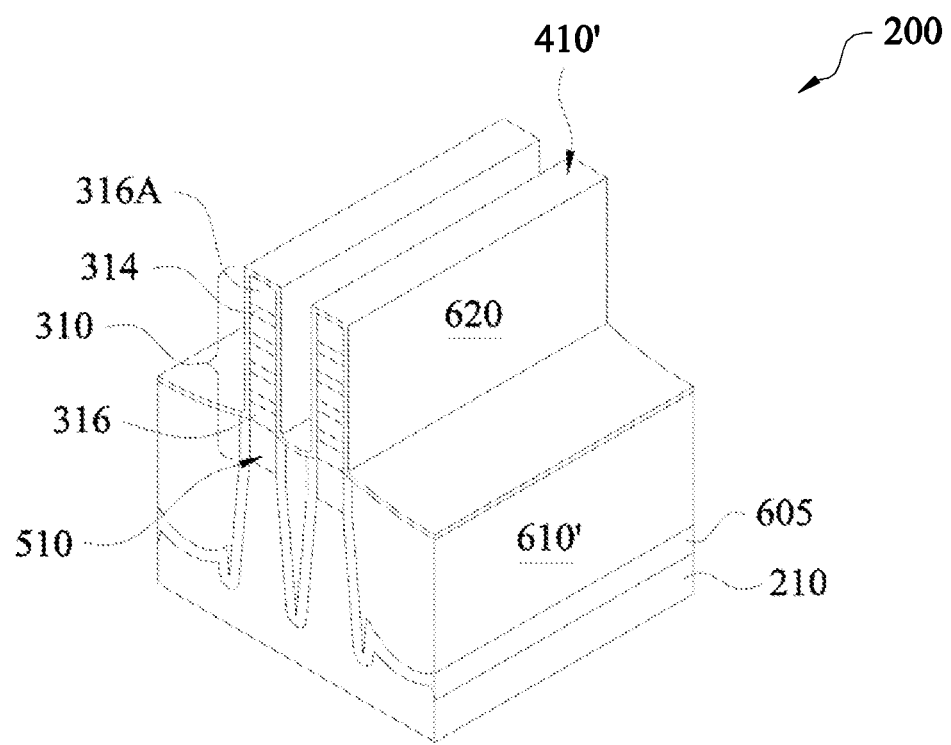

Referring to FIGS. 1 and 8, method 100 proceeds to step 114 by forming a dummy dielectric layer 620 over the fins 410'. In some embodiments, the dummy dielectric layer 620 may include $SiO_2$, silicon nitride, a high-K dielectric material and/or other suitable material. In various examples, the dummy dielectric layer 620 may be deposited by a CVD process, a subatmospheric CVD (SACVD) process, a flowable CVD process, an ALD process, a PVD process, or other suitable process. By way of example, the dummy dielectric layer 620 may be used to prevent damage to the fins 410' by subsequent processing (e.g., subsequent formation of the dummy gate stack).

Figure 9:
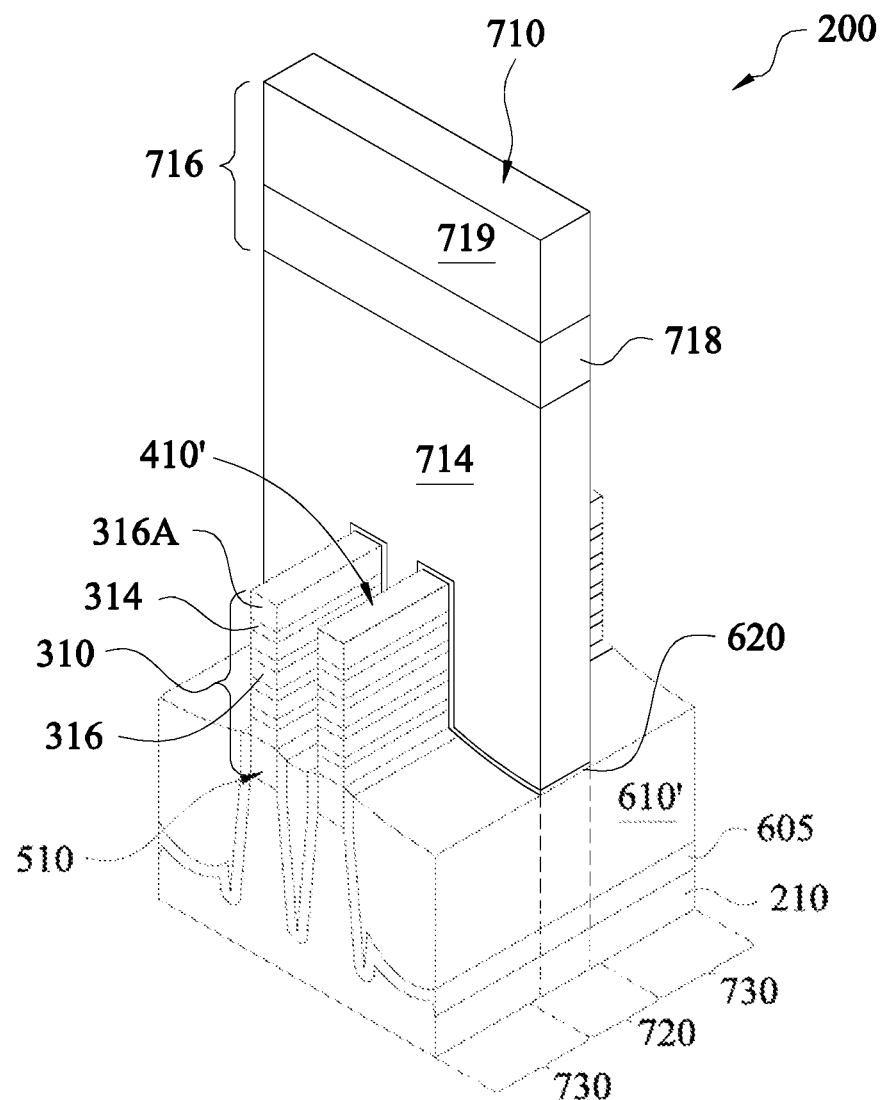

Referring to FIGS. 1 and 9, method 100 proceeds to step 116 by forming a gate stack 710. In an embodiment, the gate stack 710 is a dummy (sacrificial) gate stack and will be replaced by the final gate stack at a subsequent processing stage of the device 200. In particular, the dummy gate stack 710 may be replaced at a later processing stage by a high-K dielectric layer (HK) and metal gate electrode (MG) as discussed below. In some embodiments, the dummy gate stack 710 is formed over the substrate 210 and is at least partially disposed over the fins 410'. The portion of the fins 410' underlying the dummy gate stack 710 may be referred to as a channel region 720. The dummy gate stack 710 may also define a source/drain region 730 of the fins 410', for example, the regions of the fin 410' adjacent and on opposing sides of the channel region 720.

In some embodiments, the dummy gate stack 710 includes the dummy dielectric layer 620, an electrode layer 714, and a hard mask 716 which may include multiple layers 718 and 719 (e.g., an oxide layer 718 and a nitride layer 719). In some embodiments, the dummy dielectric layer 620 is not included in the dummy gate stack 710, for example, being removed prior to the deposition of the dummy gate stack 710. In some embodiments, an additional dummy gate dielectric layer is included in the gate stack in addition or in lieu of dummy dielectric layer 620. In some embodiments, the dummy gate stack 710 is formed by various process steps such as layer deposition, patterning, etching, as well as other suitable processing steps. Exemplary layer deposition processes includes CVD (including both low-pressure CVD and plasma-enhanced CVD), PVD, ALD, thermal oxidation, e-beam evaporation, or other suitable deposition techniques, or combinations thereof. In forming the gate stack for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

As indicated above, the dummy gate stack 710 may include an additional gate dielectric layer. For example, the dummy gate stack 710 may include silicon oxide. Alternatively or additionally, the gate dielectric layer of the dummy gate stack 710 may include silicon nitride, a high-K dielectric material or other suitable material. In some embodiments, the electrode layer 714 may include polycrystalline silicon (polysilicon). In some embodiments, the hard mask 716 includes an oxide layer 718 such as a pad oxide layer that may include SiO$_2$. In some embodiments, hard mask 716 includes the nitride layer 719 such as a pad nitride layer that may include Si$_3$N$_4$, silicon oxynitride and/or silicon carbide.

Referring again to FIG. 9, in some embodiments, after formation of the dummy gate 710, the dummy dielectric layer 620 is removed from the S/D regions 730. The etch process may include a wet etch, a dry etch, and/or a combination thereof. In the present embodiment, the etch process is chosen to selectively etch the dummy dielectric layer 620 without substantially etching the fin 410', the hard mask 716 and the dummy gate stack 710.

Figure 10:
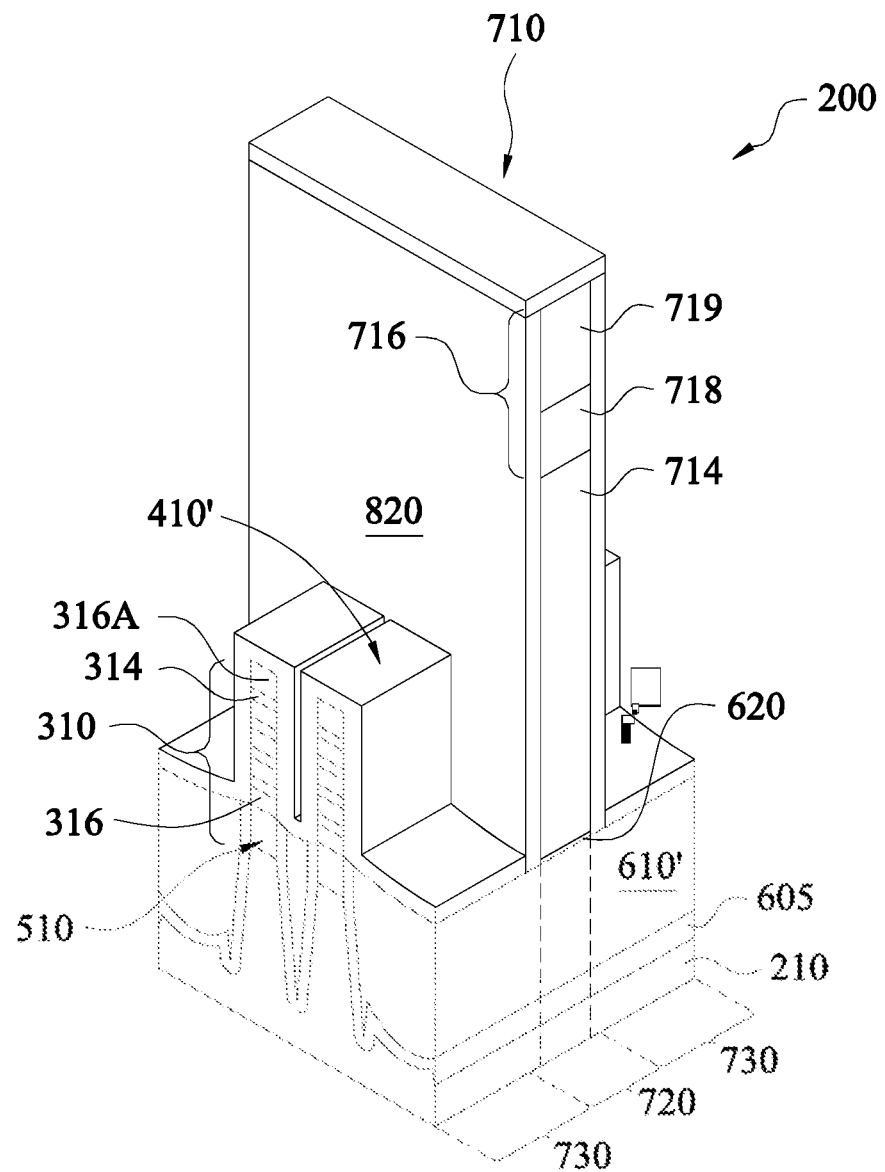

Referring to FIGS. 1 and 10, method 100 proceeds to step 118 by forming a spacer layer 820 over the substrate 210. The spacer layer 820 may be a conformal dielectric layer formed over the substrate 210, including over the exposed portion of fin 410' in the S/D regions 730. The spacer layer 820 may form spacer elements on the sidewalls of the dummy gate stack 710. The spacer layer 820 may include a dielectric material such as silicon oxide, silicon nitride, silicon carbide, silicon oxynitride, SiCN films, silicon oxycarbide (SiOCN) films, and/or combinations thereof. In some embodiments, the spacer layer 820 includes multiple layers, such as main spacer walls, liner layers, and the like. By way of example, the spacer layer 820 may be formed by depositing a dielectric material over the dummy gate stack 710 using processes such as, CVD process, a subatmospheric CVD (SACVD) process, a flowable CVD process, an ALD process, a PVD process, or other suitable process. In certain embodiments, the deposition may be followed by an etching back (e.g., anisotropically) the dielectric material.

Figure 11:
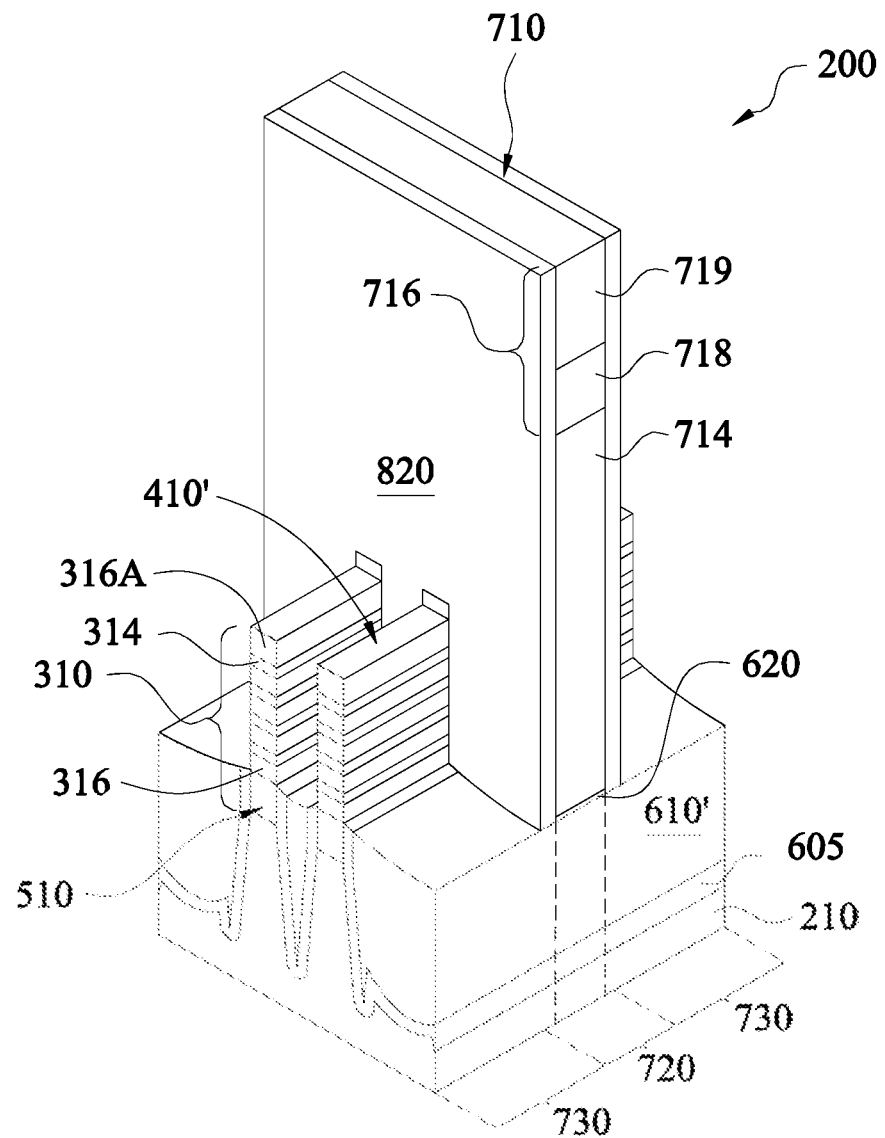

Referring to FIGS. 1 and 11, method 100 proceeds to step 120 by etching-back the spacer layer 820. In the present embodiment, the spacer layer 820 is etched back to expose portions of the fins 410' in S/D regions 730. The spacer layer 820 may remain on the sidewalls of the dummy gate structure 710 forming spacer elements while it is removed from a top surface of the dummy gate stack 710. In some embodiments, etching-back of the spacer layer 820 may include a wet etch process, a dry etch process, a multiple-step etch process, and/or a combination thereof. In some embodiments, a portion of the epitaxial layer 316A may be removed during etching the spacer layer 820. As described above, the epitaxial layer 316A with a greater thickness may compensate thickness loss and relaxes process constrains.

Figure 12A:
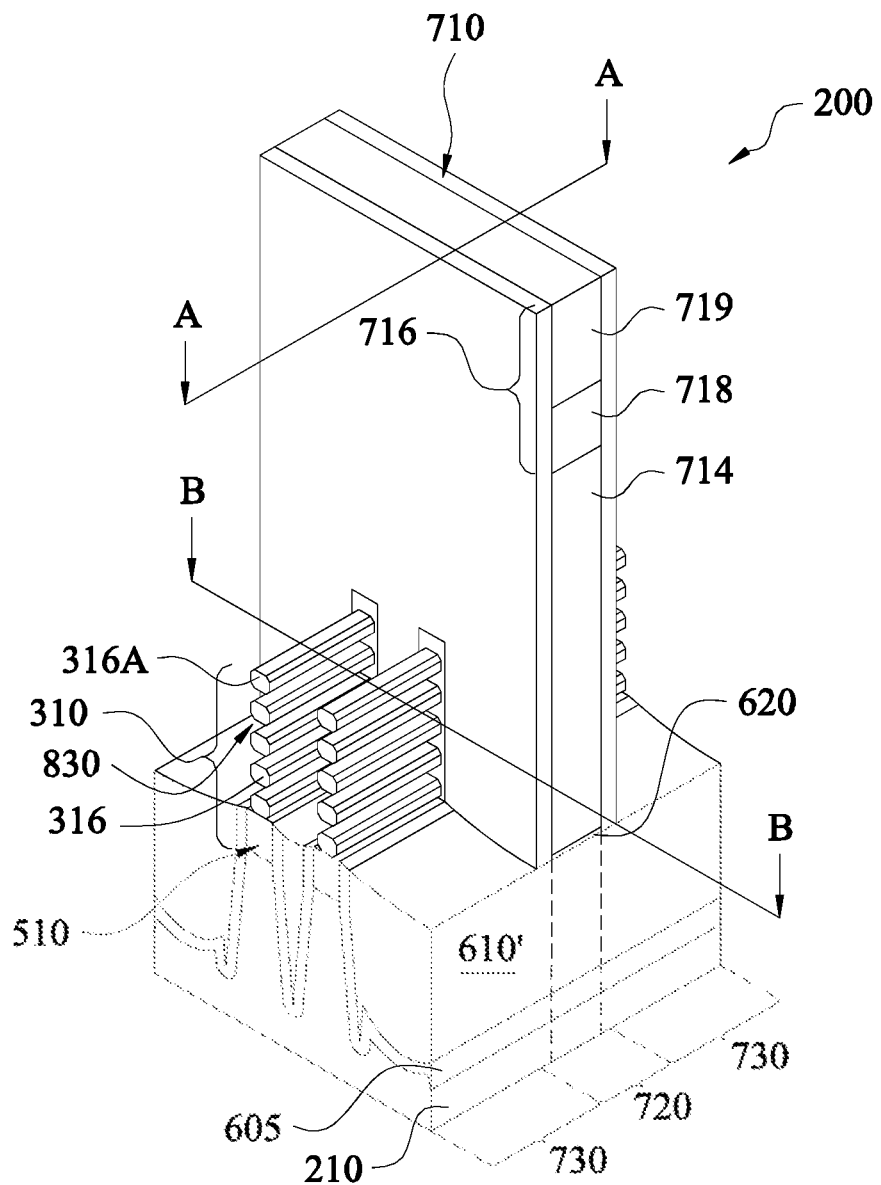
Figure 12C:
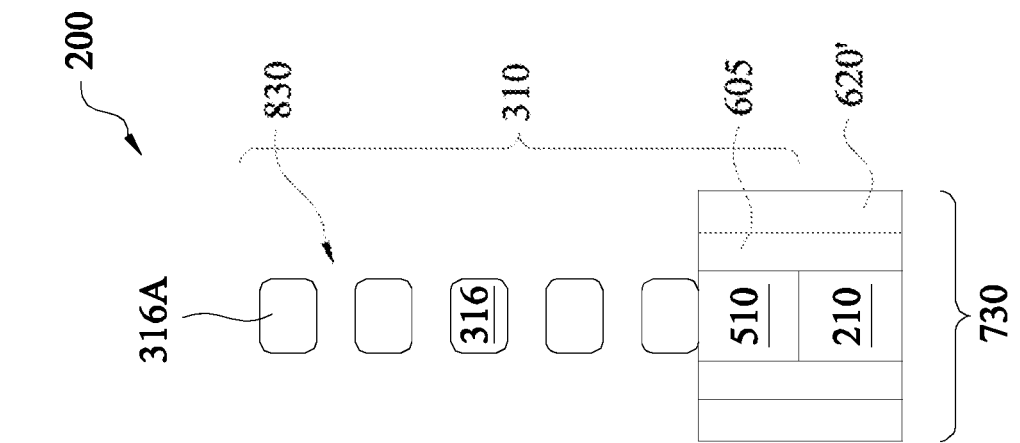
FIG. 12C is a cross-section view, corresponding to the isometric view of FIG. 12A along line B-B, of an embodiment of the device 200 according to aspects of the method of FIG. 1.
Figure 12B:
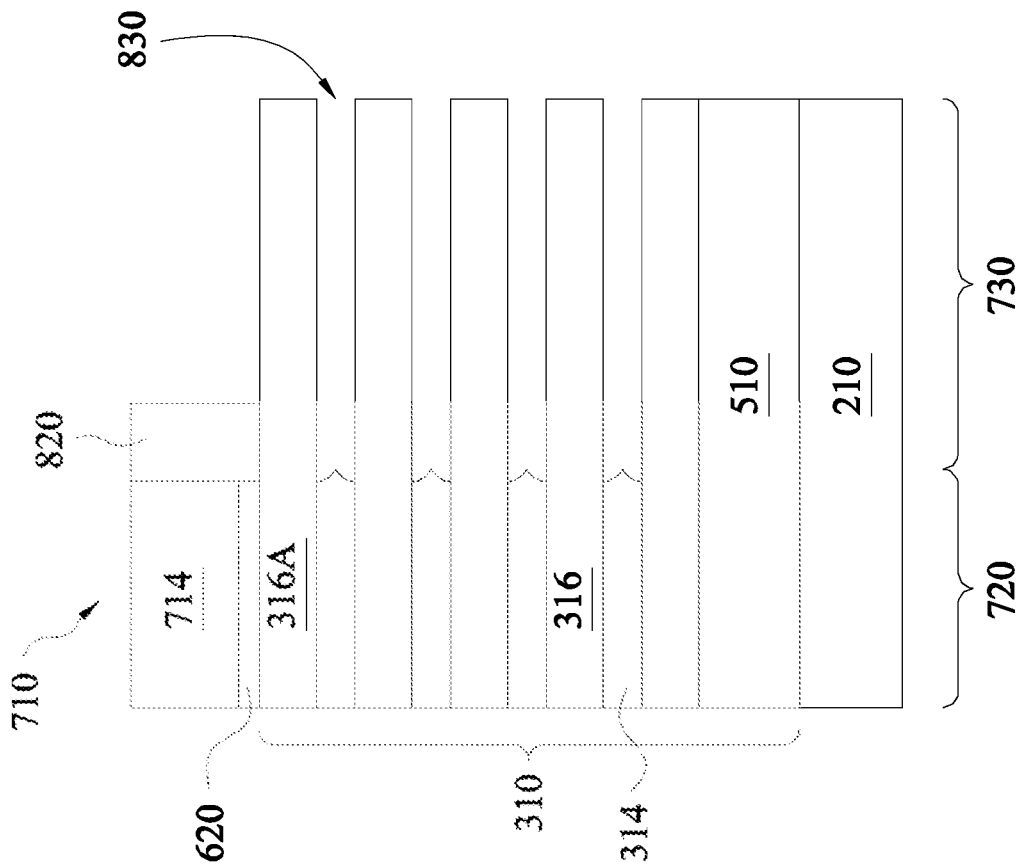
FIG. 12B is a cross-section view, corresponding to the isometric view of FIG. 12A along line A-A, of an embodiment of the device 200 according to aspects of the method of FIG. 1.
Figure 13A:
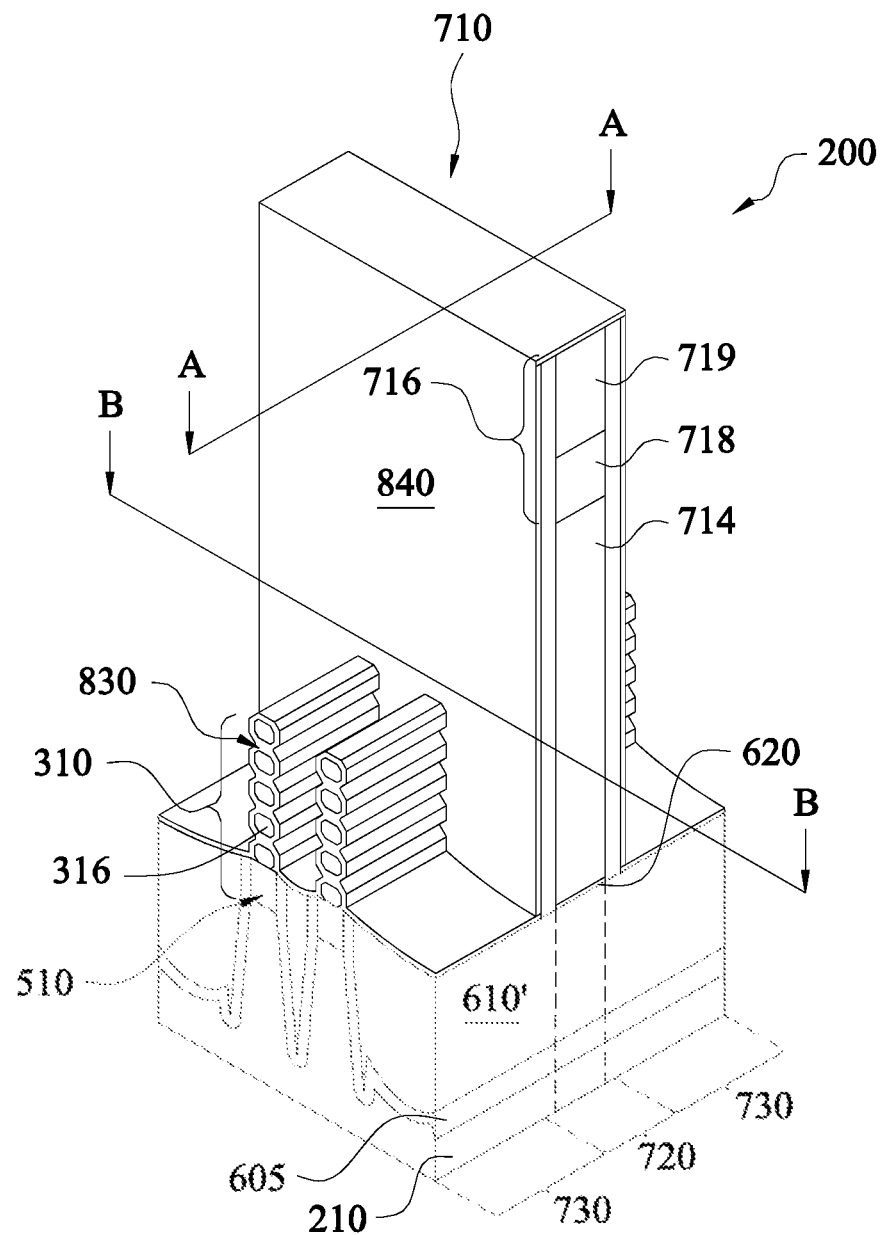
FIG. 13A is an isometric view of an embodiment of a device 200 according to aspects of the method of FIG. 1.

Referring to FIGS. 1, 12A, 12B and 12C, method 100 proceeds to step 122 by removing the first epitaxial layers 314 from the S/D region 730. FIGS. 12A-C illustrate gaps 830 in the place of the epitaxial layers 314 (FIG. 11). In the present embodiment, the first epitaxial layer 314 in the channel region 720 remains. The gaps 830 may be filled with the ambient environment (e.g., air, N$_2$). In an embodiment, the first epitaxial layers 314 are removed by a selective wet etching process. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by O$_3$ clean and then SiGeOx removed by an etchant such as NH$_4$OH. In an embodiment, the first epitaxial layers 314 are SiGe and the second epitaxial layers 316/316A are silicon allowing for the selective removal of the first epitaxial layers 314. It is noted that as illustrated in the accompanying figures the second epitaxy layers 316/316A (e.g., nanowires) have a substantially rounded shape (e.g., cylindrical) due to removal process of the first epitaxial layer 314.

Referring to FIGS. 1, 13A, 13B and 13C, method 100 proceeds to step 124 by forming an inner-spacer layer 840 over the substrate 210, including wrapping over each of the second epitaxial layers 316/316A in the S/D region 730. The inner-spacer layer 840 may fill the gaps 830 provided by the removal of the epitaxial layers 314 described in step 118 above. The inner-spacer layer 840 may include silicon oxide, silicon nitride, and/or other suitable material. In some embodiments, the inner-spacer 840 may be formed similarly in many respects to the spacer layer 820 discussed above association with FIG. 10.

Referring again to FIGS. 1, 14A, 14B and 14C, method 100 proceeds to step 126 by etching-back the inner-spacer layer 840. In the present embodiment, the inner-spacer layer 840 is etched back to expose portions of the fins 410' in S/D regions 730 and removed from the dummy gate stack 710 in the channel region 720. The inner-spacer layer 840 is removed from a top surface and the lateral surfaces of the epitaxial stack 310 but it remains interposing and disposed below the second epitaxial layer 316/316A of the epitaxial stack 310 in the S/D region 730. In some embodiments, the inner-spacer layer 840 is removed by a wet etch process, a dry etch process, a multiple-step etch process, and/or a combination thereof.

Figure 14A:
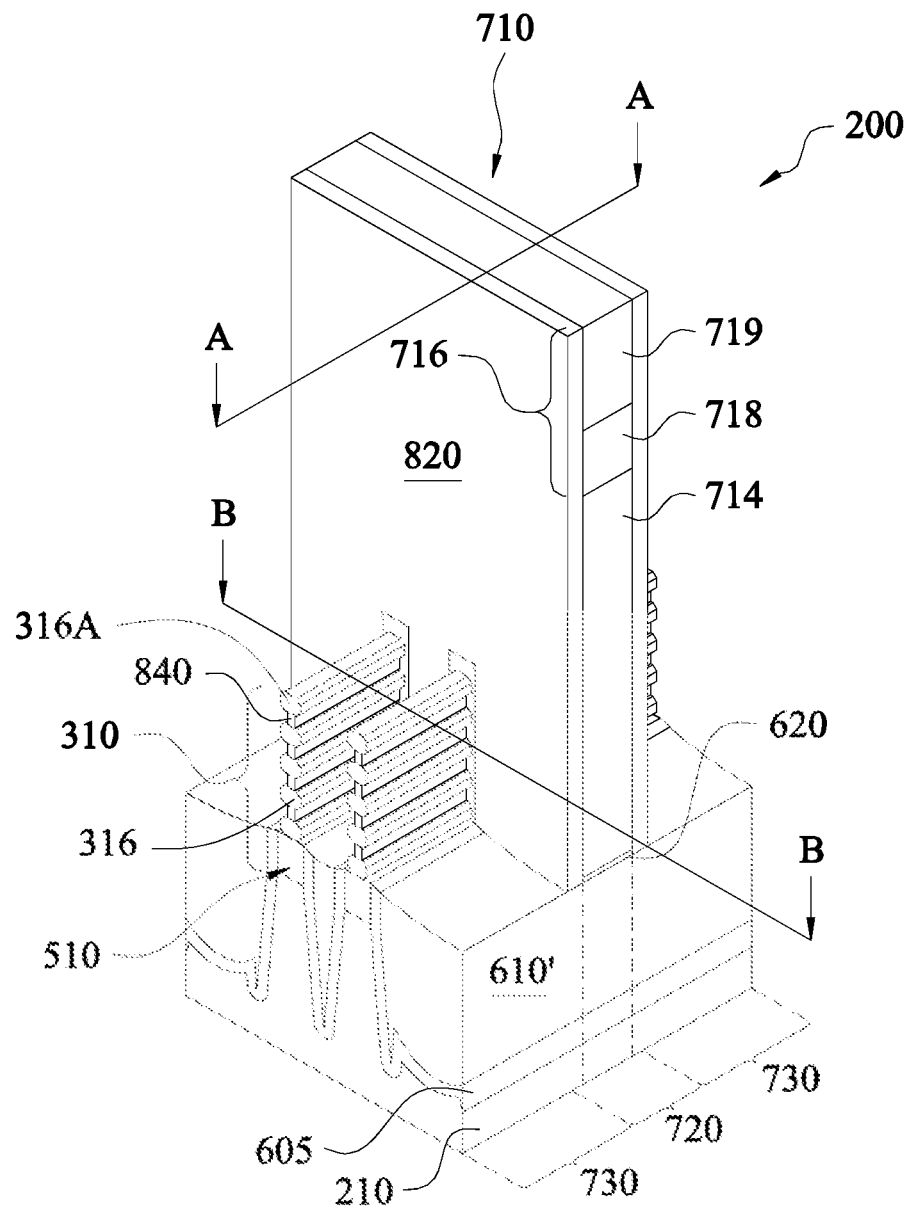
FIG. 14A is an isometric view of an embodiment of a device 200 according to aspects of the method of FIG. 1.
Figures 14D, 14E:
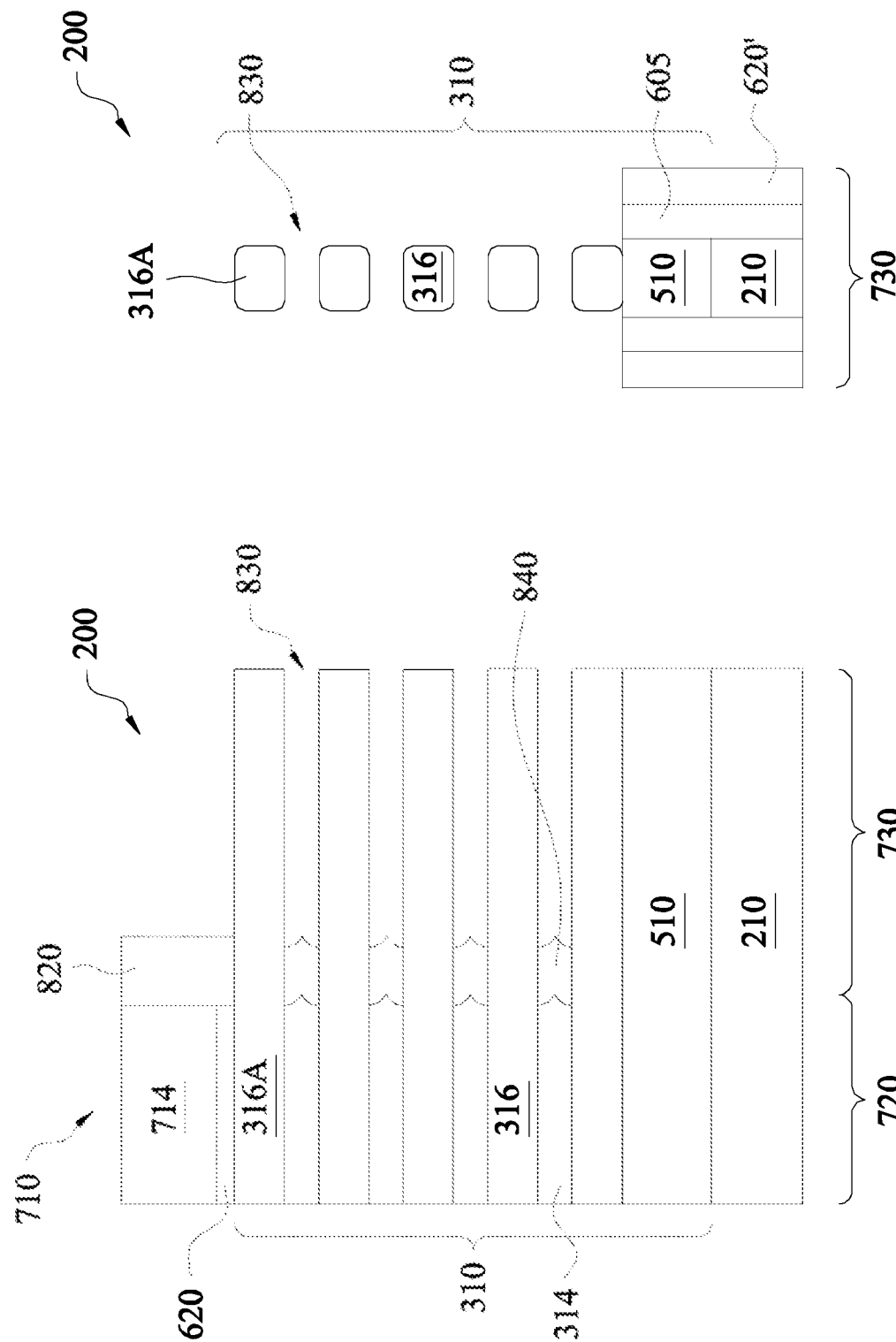
Figure 15:
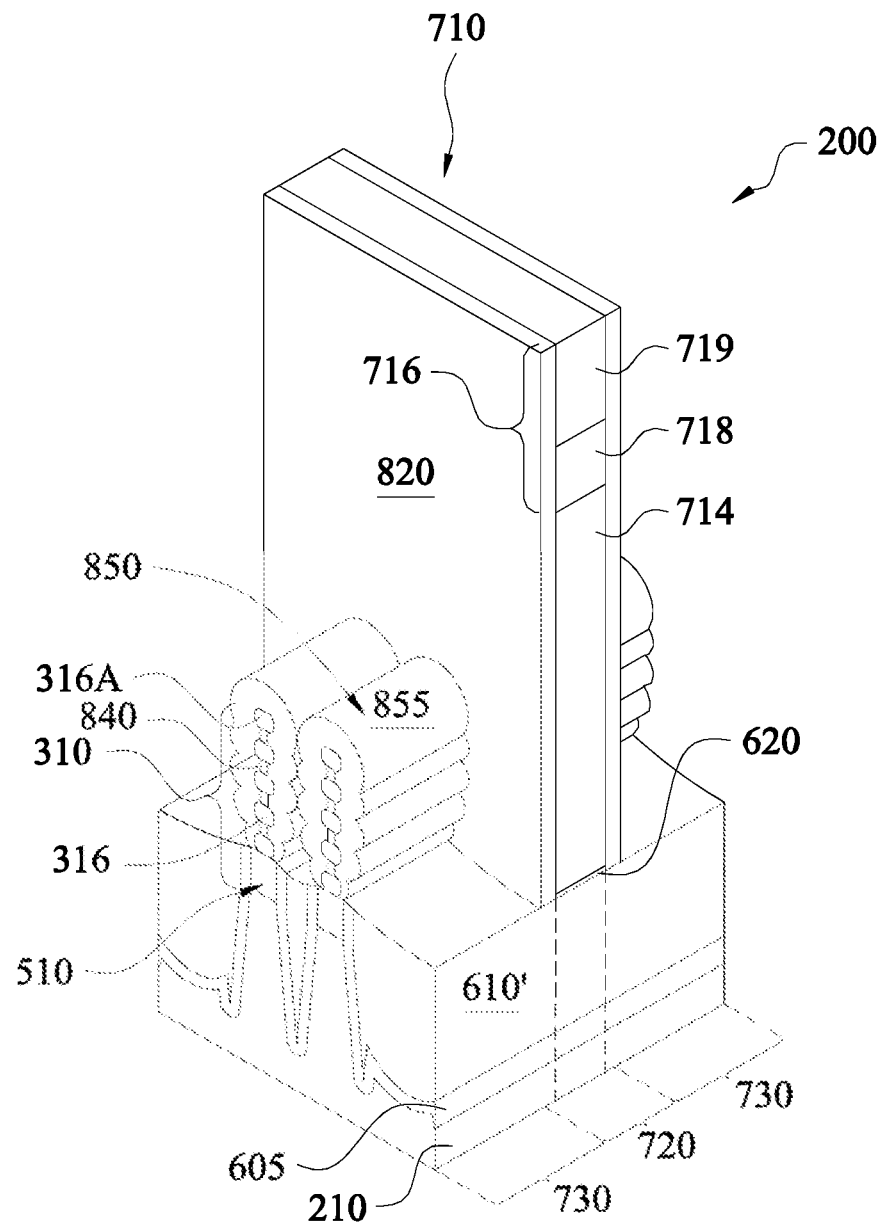
FIGS. 15, 16, 17, 18, 19, 20, 21, 22, 23A and 23B are isometric views of an embodiment of a device 200 according to aspects of the method of FIG. 1.

Alternatively, in some embodiments, the inner-spacer layer 840 is etched back such that it is removed from most of the S/D region, as shown in FIGS. 14D and 14E. The remaining inner-spacer layer 840 in the S/D region 730 will provide an etch stop layer during subsequent final gate formation. FIGS. 14D and 14E illustrate gaps 830 in the place of the epitaxial layers 314 being filled with the ambient environment (e.g., air, $N_2$).

Referring again to FIGS. 1 and 15, method 100 proceeds to step 128 forming S/D features 850 in the S/D region 730. The S/D features 850 may be formed by performing an epitaxial growth process that provides an epitaxy material cladding the epitaxial stack 310. In some embodiments, the S/D features 850 formed by epitaxially growing a semiconductor material 855 on the nanowire 316/316A. In other words, the epitaxially cladding layer 855 is formed around nanowires 316/316A, which has the inner-spacer layer 840 interposed and disposed below the nanowire 316/316A, this may be referred to as forming a "cladding" around the nanowire.

For circumstances where the inner-spacer layer 840 is removed from the most portion of the S/D regions 730 (as shown in FIGS. 14D-14E), the epitaxial cladding layer 855 filled in the gags 830 in the S/D region 730.

In various embodiments, the epitaxially cladding layer 855 may include Ge, Si, GaAs, AlGaAs, SiGe, GaAsP, SiP, and/or other suitable material. In some embodiments, the epitaxially cladding layer 855 may be in-situ doped during the epi process. For example, in some embodiments, the epitaxially cladding layer 855 may be doped with boron. In some embodiments, the epitaxially cladding layer 855 may be doped with carbon to form Si:C source/drain (S/D) features, phosphorous to form Si:P S/D features, or both carbon and phosphorous to form SiCP S/D features. In an embodiment, the nanowire 316/316A is silicon and the epitaxially cladding layer 855 also is silicon. In some embodiments, the nanowire 316/316A and epitaxially cladding layer 855 may comprise a similar material, but be differently doped. In other embodiments, the nanowire 316/316A includes a first semiconductor material, the epitaxially cladding layer 855 includes a second semiconductor different than the first semiconductor material.

In some embodiments, the epitaxially cladding layer 855 is not in-situ doped, and, for example, instead an implantation process is performed to dope the epitaxially cladding layer 855. As described above, the isolation region 510 which remains present beneath the gate stack 710 blocks potential unwanted diffusion of the implanted dopants.

Thus, the S/D features 850 associated with the dummy gate stack 710 include the nanowires 316/316A and/or the epitaxially grown material 855. Dielectric material from the inner-spacer layer 840 interposes the nanowires 316/316A. Each of the nanowires 316/316A extends into the channel region, thereby forming a multi-channel, multi-S/D region device.

Figure 16:
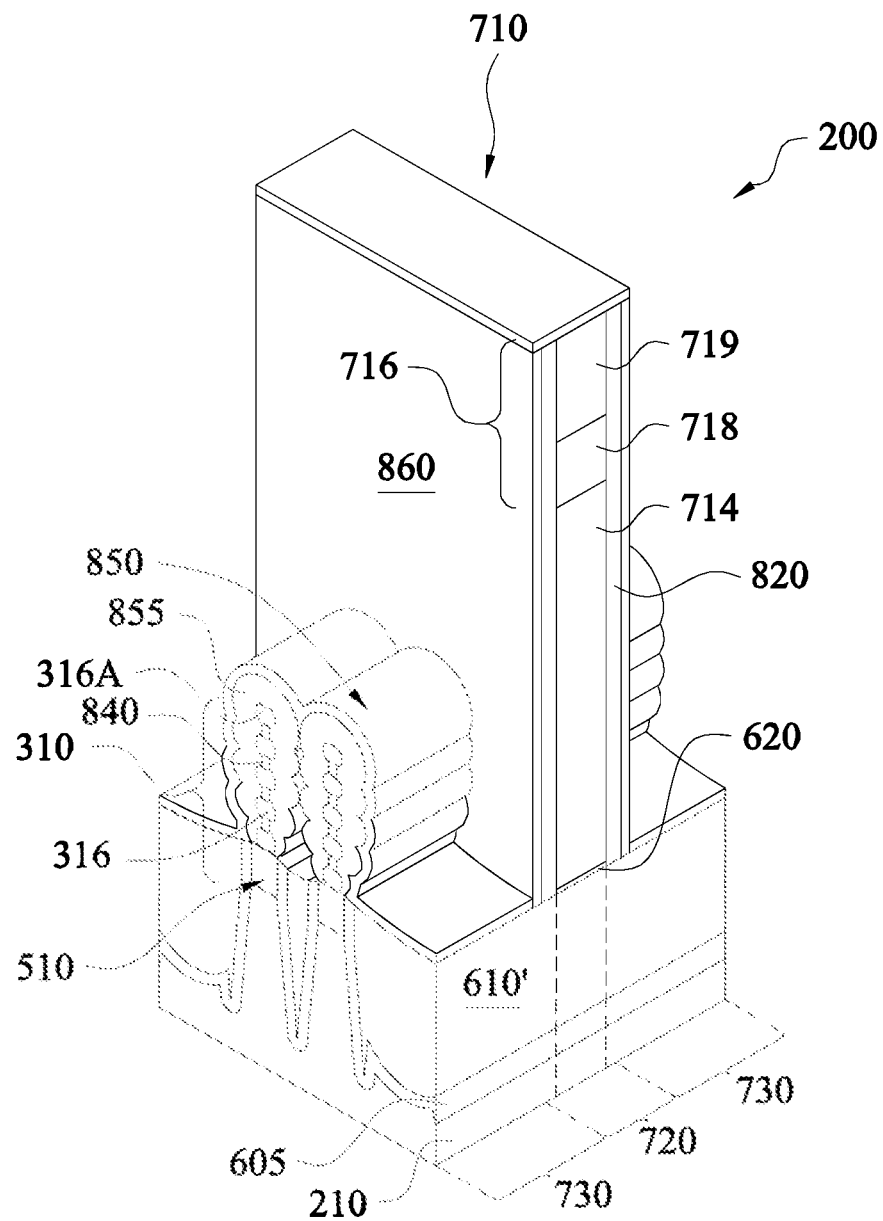

Referring to FIGS. 1 and 16, method 100 proceeds to step 130 forming a contact etch stop layer (CESL) 860 over the substrate 210. In some examples, the CESL 860 includes a silicon nitride layer, silicon oxide layer, a silicon oxynitride layer, and/or other materials known in the art. The CESL 860 may be formed by PECVD) process, and/or other suitable deposition or oxidation processes.

Figure 17:
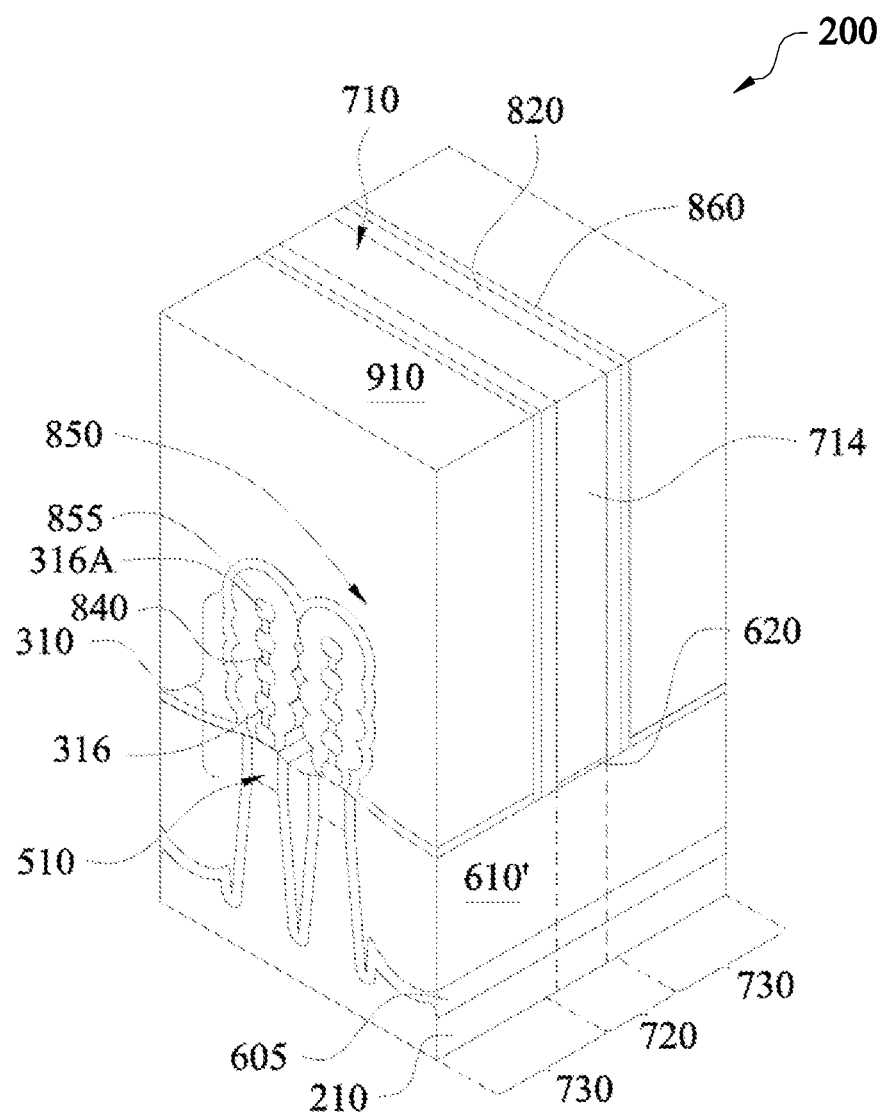

Referring to FIGS. 1 and 17, method 100 proceeds to step 132 by forming an inter-layer dielectric (ILD) layer 910 over the substrate 210. In certain embodiments, after forming the ILD layer 910, the dummy gate stack 710 is removed (as discussed below). In some embodiments, the ILD layer 910 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 910 may be deposited by a PECVD process or other suitable deposition technique. In some embodiments, after formation of the ILD layer 910, the semiconductor device 200 may be subject to a high thermal budget process to anneal the ILD layer. As described above, the isolation region 510 can block some potential diffusion of APT dopants from within the substrate regions into the device channel region during such high thermal budget processing.

In some examples, after depositing the ILD layer 910, a planarization process may be performed to expose a top surface of the dummy gate stack 710. For example, a planarization process includes a CMP process which removes portions of the ILD layer 910 overlying the dummy gate stack 710 and planarizes a top surface of the semiconductor device 200. In addition, the CMP process may remove the hard mask 716 overlying the dummy gate stack 710 to expose the electrode layer 714, such as a polysilicon electrode layer.

Figure 18:
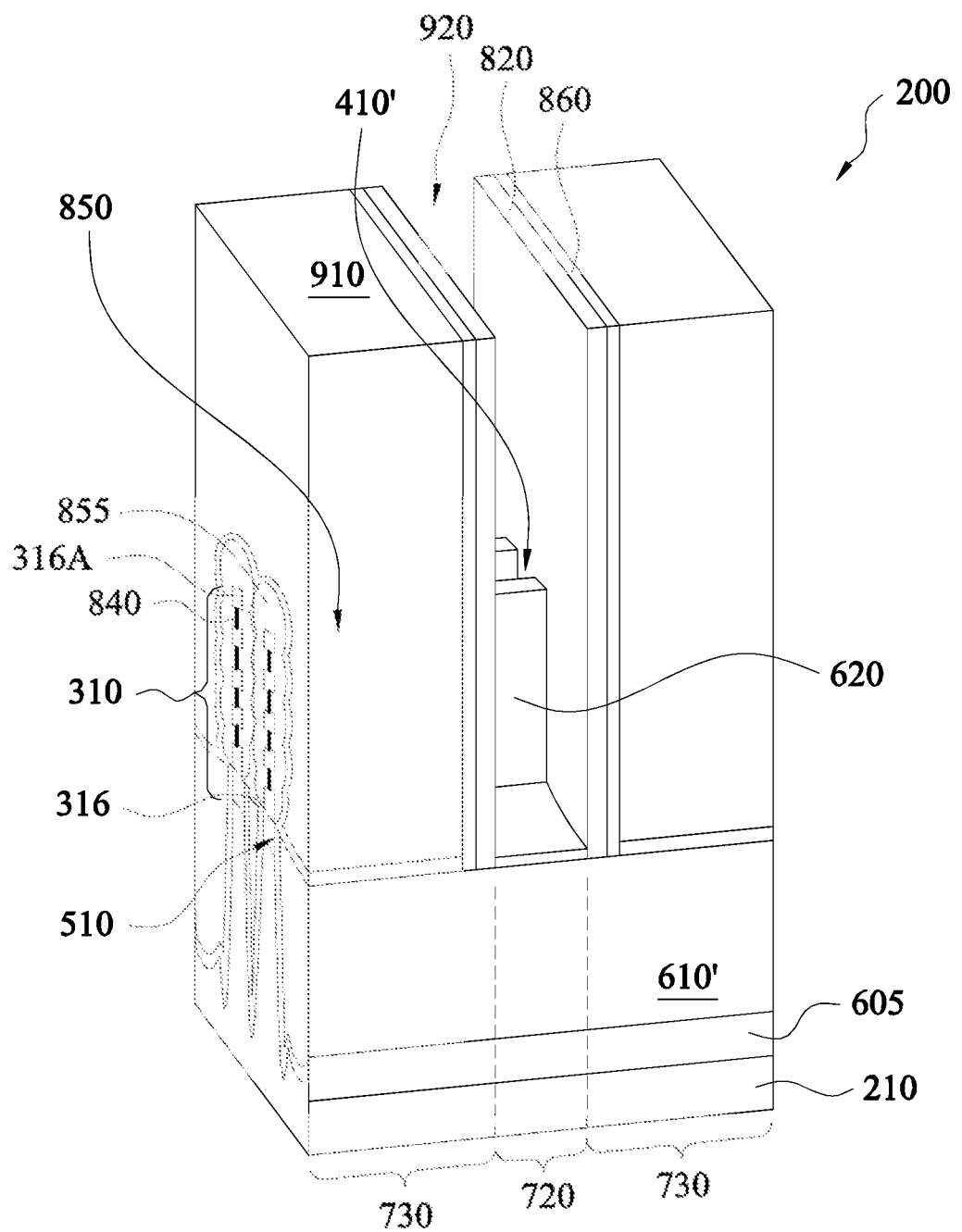

Referring to FIGS. 1 and 18, method 100 proceeds to step 134 by removing the remaining previously formed dummy gate stack 710 to form a gate trench 920 in the channel region 720. A final gate structure (e.g., including a high-K dielectric layer and metal gate electrode) may be subsequently formed in the gate trench 920, as described below. The removal of the dummy gate stack features 710 may be performed using a selective etch process such as a selective wet etch, a selective dry etch, or a combination thereof.

Figure 19:
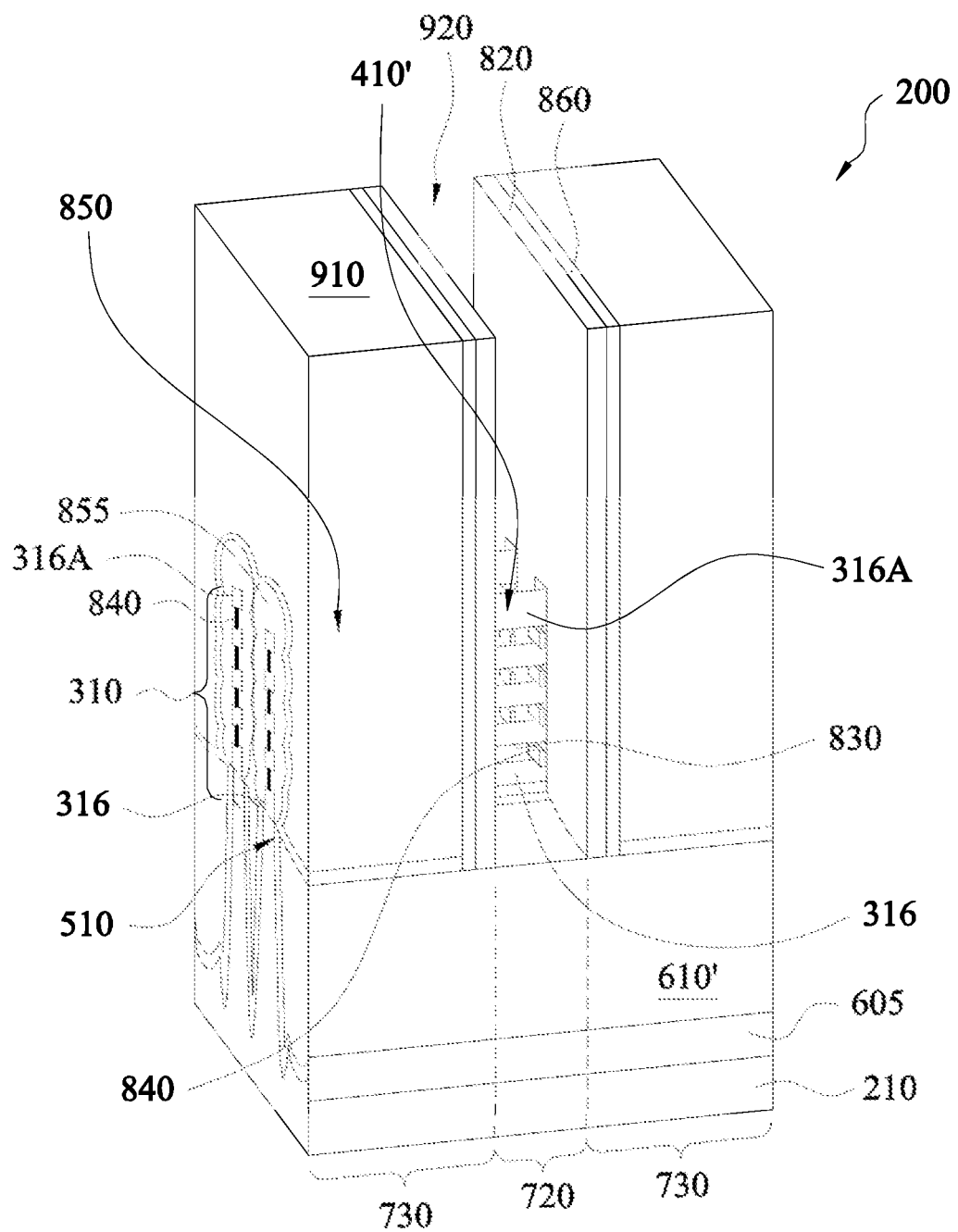

Referring to FIGS. 1 and 19, method 100 proceeds to step 136 by removing the dummy dielectric layer 620 and the first epitaxial layer 314 from the fin 410' in the gate trench 920. The dummy dielectric layer 620 is removed similarly in many respects to the etching process discussed above association with FIG. 9. The first epitaxial layer 314 is removed similarly in many respects to the etching process discussed above association with FIGS. 12A-12C. As a result, the second epitaxial layers 316/316A (nanowires) are exposed with in the gate trench 920. It is noted that during the interim processing stage of step 134, gaps 830 are provided between the adjacent nanowires in the channel region (e.g., gaps 830 between epitaxy layers 316/316A). The gaps 830 may be filled with the ambient environment conditions (e.g., air, nitrogen, etc). It is also noted that as illustrated in the accompanying figures the second epitaxy layers 316/316A (e.g., nanowires) have a substantially rounded shape (e.g., cylindrical) due to dummy oxide removal and/or high-k dielectric deposition processes.

As has been mentioned previously, for circumstances where the inner-spacer layer 840 is removed from the most portion of the S/D regions 730 but remains in the portion of the S/D region 730 which is close to the channel region 720 (as shown in FIGS. 14D-14E), the inner-spacer layers 840 serve as an etch stop layer to protect the epitaxially cladding layer 855 of the S/D features 850 during removing the first epitaxial layers 314 in the gate trench 920.

Figure 20:
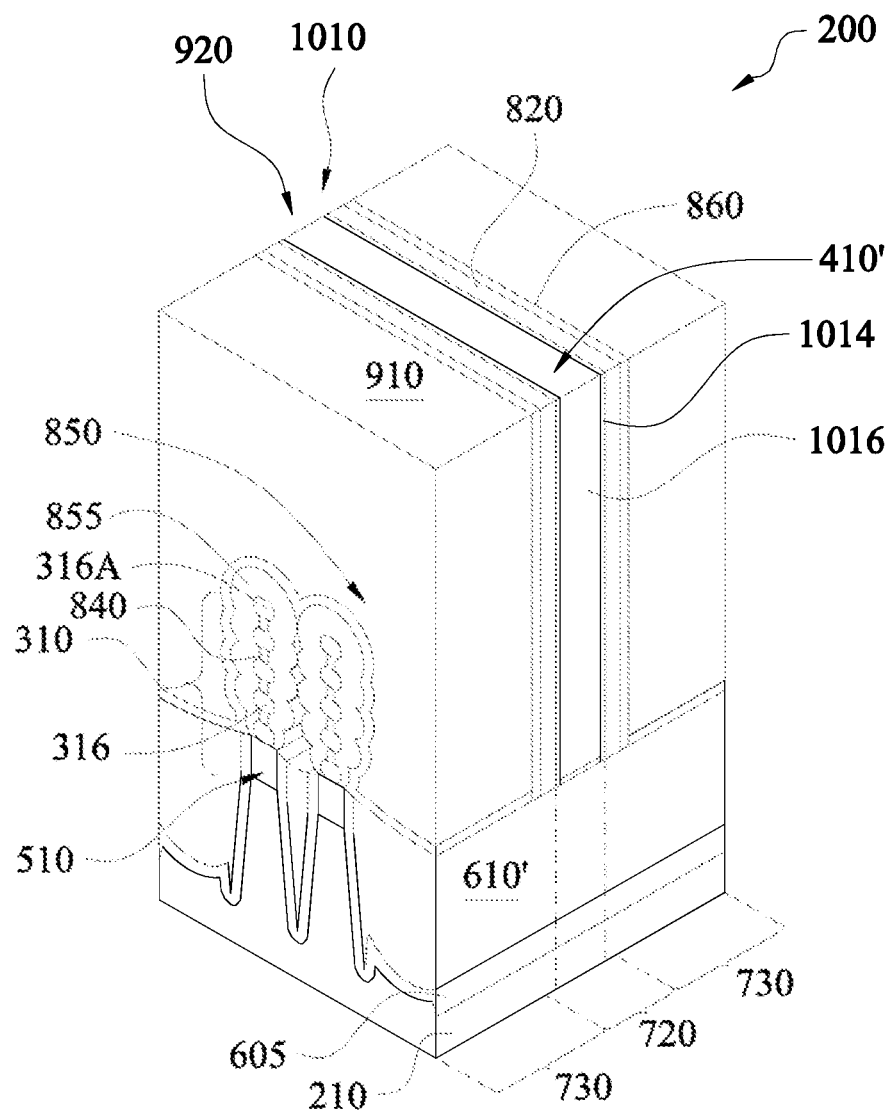

Referring to FIGS. 1 and 20, method 100 proceeds to step 138 by forming final gate stacks 1010 within the gate trench 920, including wrapping over the nanowires 316/316A. The final gate structure may be the gate of a multi-gate transistor. The final gate structure may be a high-K/metal gate stack, however other compositions are possible. In some embodiments, the final gate structure forms the gate associated with the multi-channels provided by the plurality of nanowires (now having gaps 830 there between) in the channel region 720. In the present embodiment, high-K/metal gate (HK/MG) stacks 1010 are formed within the gate trenches 920. In various embodiments, the HK/MG stack 1010 includes an interfacial layer 1012 (not shown), a high-K gate dielectric layer 1014 formed over the interfacial layer 1012, and/or a metal layer 1016 formed over the high-K gate dielectric layer 1014. High-K gate dielectrics, as used and described herein, include dielectric materials having a high dielectric constant, for example, greater than that of thermal silicon oxide (~3.9). The metal layer 1016 used within high-K/metal gate stack 1010 may include a metal, metal alloy, or metal silicide. Additionally, the formation of the HK/MG stack 1010 may include depositions to form various gate materials, one or more liner layers, and one or more CMP processes to remove excessive gate materials and thereby planarize a top surface of the semiconductor device 200.

In some embodiments, the interfacial layer 1020 may include a dielectric material such as silicon oxide ($SiO_2$), HfSiO, or silicon oxynitride (SiON). The interfacial layer 1012 may be formed by chemical oxidation, thermal oxidation, ALD, CVD, and/or other suitable method. The gate dielectric layer 1014 of the HK/MG stack 1010 may include a high-K dielectric layer such as hafnium oxide ($HfO_2$). Alternatively, the gate dielectric layer 1014 of the HK/MG stack 1010 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer 1014 may be formed by ALD, PVD, CVD, oxidation, and/or other suitable methods.

The metal layer 1016 of the HK/MG stack 1010 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer 1016 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the metal layer 1016 may be formed by ALD, PVD, CVD, e-beam evaporation, or other suitable process. Further, the metal layer 1016 may be formed separately for NFET and PFET which may use different metal layers. In various embodiments, a CMP process may be performed to remove excessive metal from the metal layer 1016 hereby provide a substantially planar top surface of the metal layer 1016.

Figure 21:
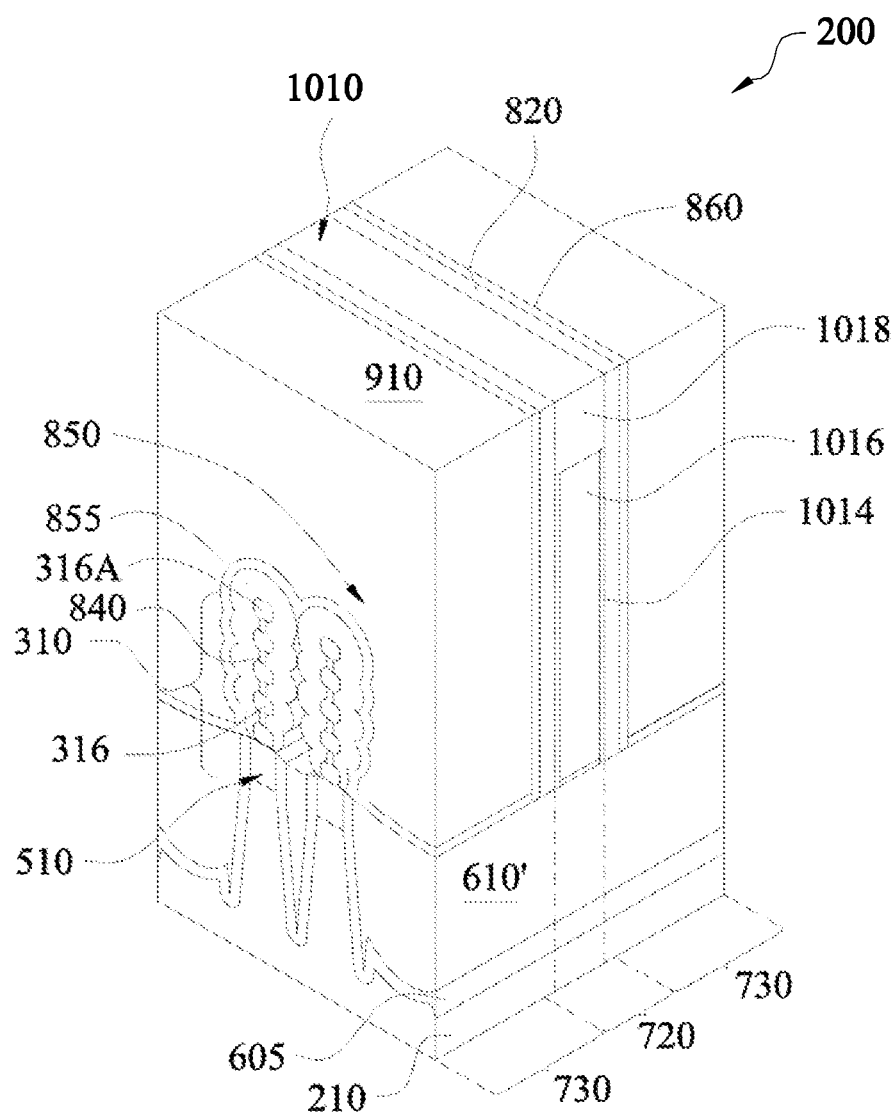

Referring to FIGS. 1 and 21, method 100 proceeds to step 140 by forming a patterned hard mask 1020 over the substrate 210. In some embodiments, prior to forming the hard mask 1020, a gate hard mask 1018 is formed over the HK/MG stack 1010 to protect the HK/MG stack 1010 during subsequent etching process. The gate hard mask 1018 may include silicon nitride, silicon carbide, silicon oxynitride, and/or combinations thereof. The gate hard mask 1018 may be formed by processes of etching and deposition. The patterned HM 1020 has an opening 1025 defining S/D contacts to be formed later. The opening 1020 aligns to the ILD layer 910 over designated S/D features 850. In some embodiments, the opening 1020 extends to more than one S/D features 850 and each if its side edge locates within a respective edge of the S/D feature 850. In some embodiments, the patterned HM 1020 may include a patterned photoresist layer and formed by a by a lithography process. Alternatively, the patterned HM 1020 may be formed by depositing a HM layer, forming a patterned photoresist layer over the HM layer by a lithography process and etching the HM material layer through the patterned photoresist layer to form the patterned HM 1020.

Figure 22:
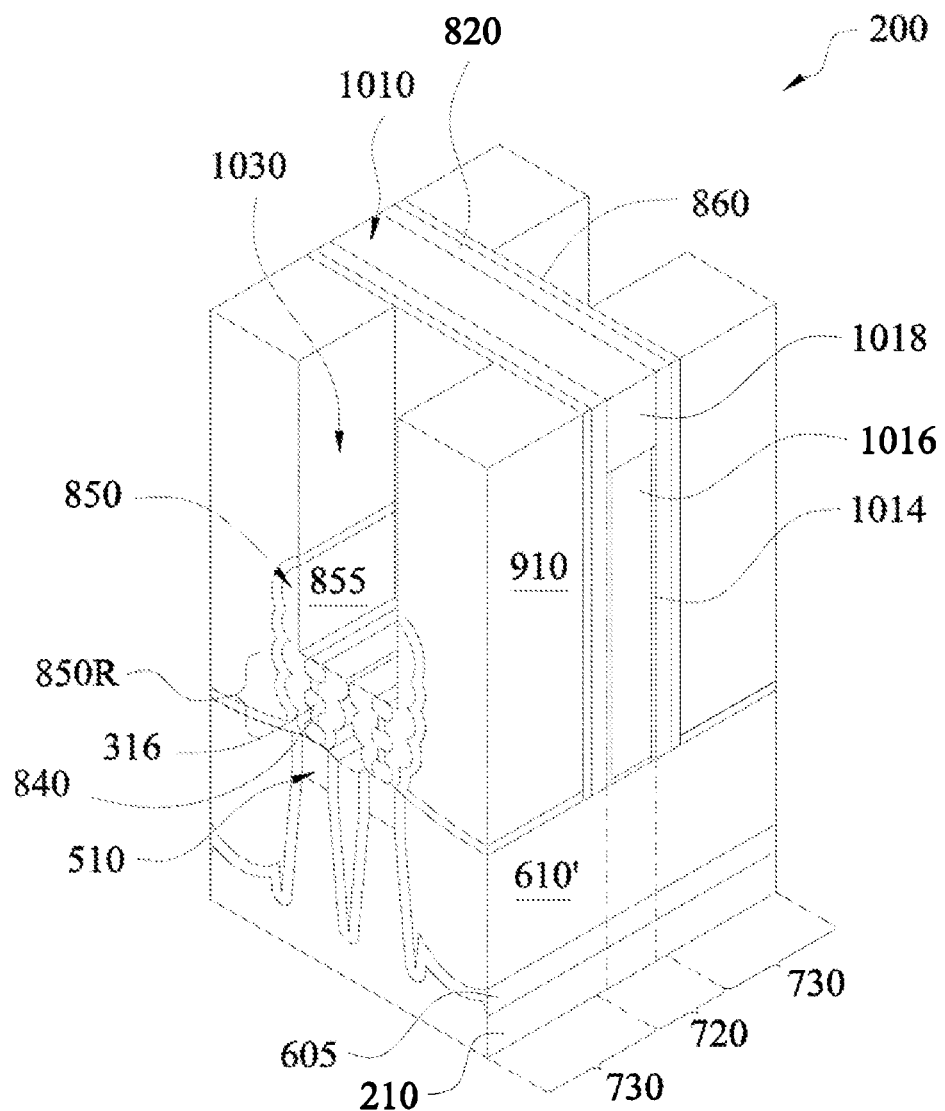

Referring to FIGS. 1 and 22, method 100 proceeds to step 142 by removing the ILD layer 910 through the opening 1025 and a portion of the S/D features 850 to form a S/D contact trench 1030. In the present embodiment, a plurality of top nanowires 316/316A associated with the removed portion of the S/D features 850 is removed as well during trench etch process. The remaining S/D feature 850 in the S/D region 730 is referred as 850R and it includes a multiple of nanowires 316. In some embodiments, the S/D contact trench 1030 is formed such that its bottom is shared by more than one S/D features 850R and so it referred to as a common S/D trench. Its lower portions of sidewalls are formed by epitaxially cladding layer 855 and its upper portions are formed by the ILD layer 910.

The trench etch may include a wet etch, a dry etch, and/or a combination thereof. As an example, a dry etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. After forming the common S/D contact trenches 1030, the patterned HM 1020 is removed by an etch process. In one example where the first patterned HM 1020 is a photoresist pattern, the patterned HM 1020 is removed by wet stripping and/or plasma ashing.

Figure 23A:
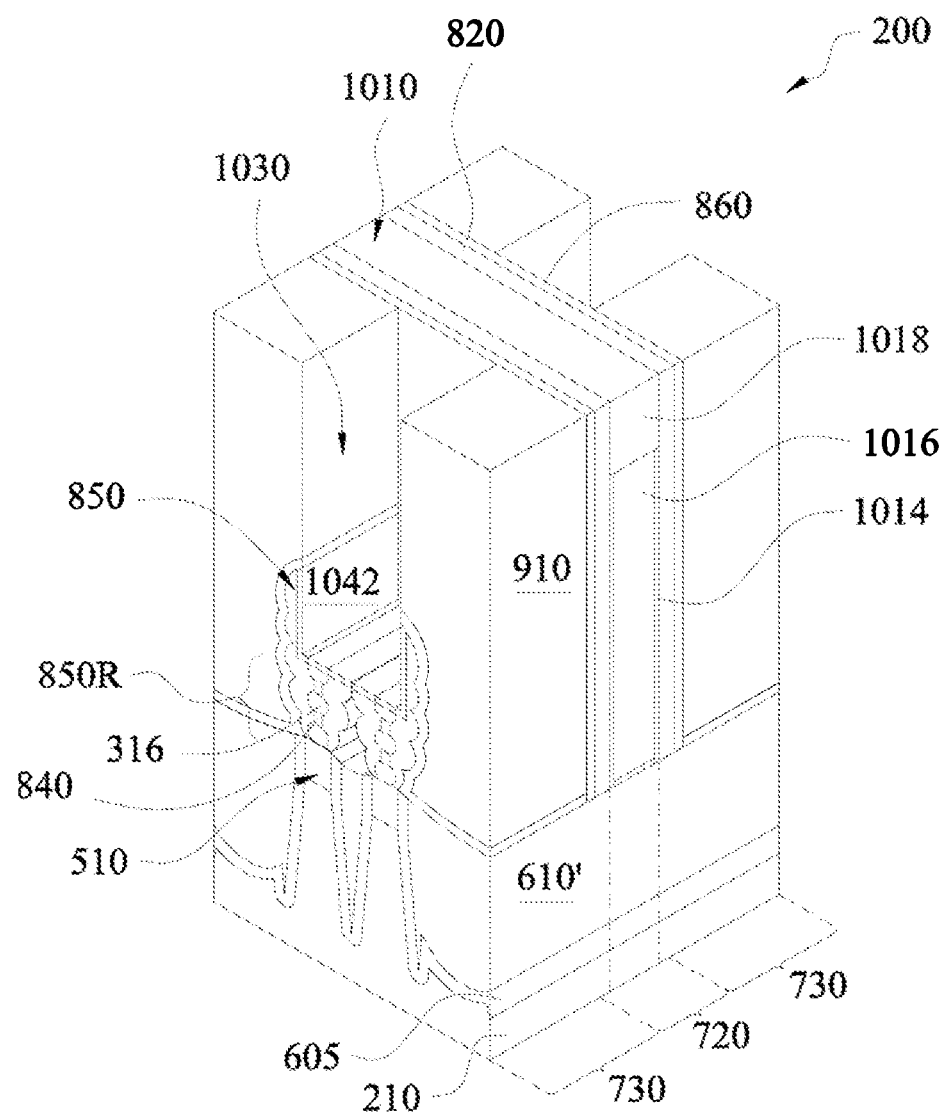

Referring to FIGS. 1, 23A, 23B, 23C and 23D, method 100 proceeds to step 144 by depositing a conductive layer 1045 in the common S/D contact trenches 1030 to form S/D contact metal 1050. In the present, prior to depositing the conductive layer 1045, a silicide layer 1042 is formed on the S/D feature 850R to reduce the contact resistance, as shown in FIG. 23A. Since the silicide layer 1042 is formed after forming the gate stack 1010, it is referred to as a silicide-last scheme. The silicide layer 1042 is formed over the top surface of the S/D 850R and over the epitaxially cladding layer 855 along sidewalls of the common S/D contact trench 1030. The silicide layer 1042 may include such materials as nickel silicide, cobalt silicide, tungsten silicide, tantalum silicide, titanium silicide, platinum silicide, erbium silicide, palladium silicide, or combinations thereof. The silicide layer 1042 may be formed by silicidation such as self-aligned silicide (Salicide), in which a metal is deposited, reacted with silicon during an annealing process, and then the unreacted metal is removed by etch. Particularly, after the metal deposition, temperature is raised to for annealing to enhance reaction between Si and metal to form silicide, finally unreacted metal may be etched away. Annealing may be one step or multi-step annealing depending on metal material and other conditions. Alternatively, the silicide layer 1042 may be formed by a procedure including silicide deposition, such as CVD, PVD, or ALD.

Figure 23B:
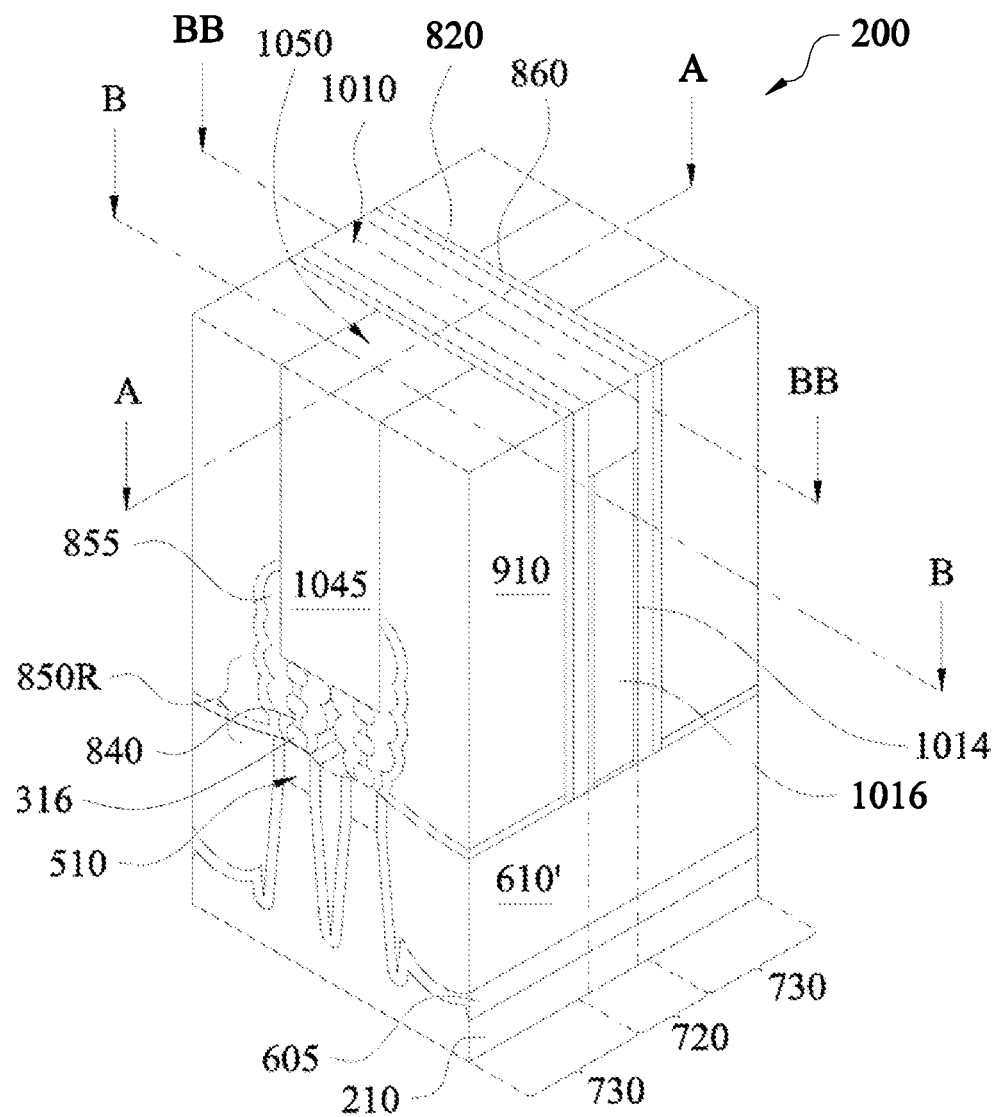

As shown in FIG. 23B, the conductive layer 1045 is then filled in the common S/D contact trench 1030 such that it extends within the common S/D contact trenches 1030 to the S/D features 850R. The conductive layer 1045 may include copper (Cu), aluminum (Al), tungsten (W), copper, copper magnesium (CuMn), copper aluminum (CuAl) or copper silicon (CuSi), and/or other suitable conductive material. The S/D contact metal 1050 may be formed by PVD, CVD, metal-organic chemical vapor deposition (MOCVD), or plating. In some embodiments, a CMP process is performed to remove excessive the conductive layer 1045 from the ILD layer 910 hereby provide a substantially coplanar top surface with a top surface of the ILD layer 910.

The device 200 may perform as a gate-all-around (GAA) device, the HK/MG stack 1010 being formed on multiple sides of the nanowire 316. The multi-gate device 200 is illustrated in isometric views in FIGS. 23A and 23B and corresponding cross-sectional views in FIG. 23C (cross-sectional along line BB-BB through the gate structures 1010), FIG. 23D (cross-sectional along line A-A), FIG. 23E (cross-sectional along line B-B through the S/D feature 850R).

Figure 23C:
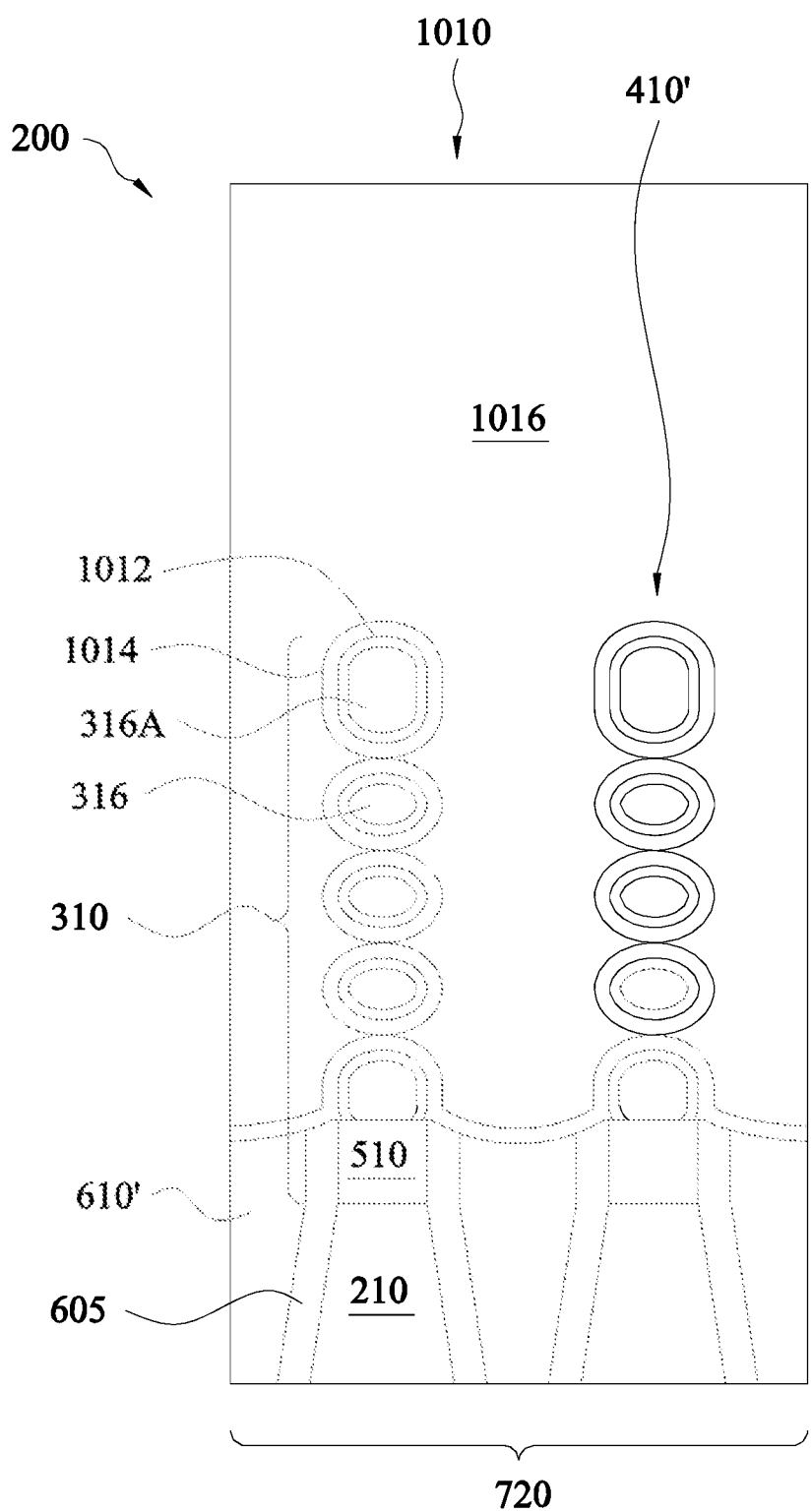
FIGS. 23C and 23F are cross-section views, corresponding to the isometric view of FIG. 23B along line BB-BB, of an embodiment of the device 200 according to aspects of the method of FIG. 1.
Figure 23D:
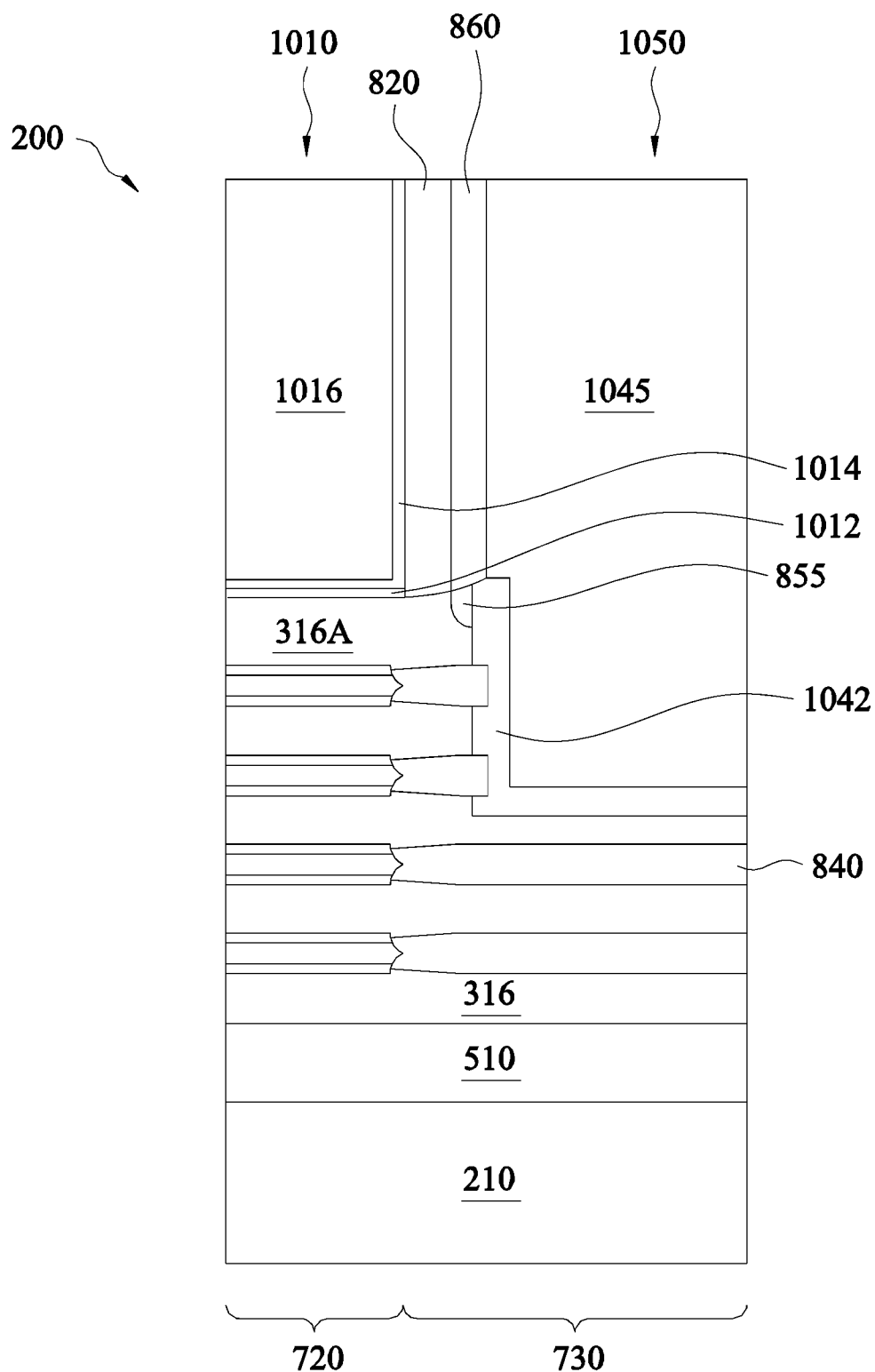
FIGS. 23D and 23G are cross-section views, corresponding to the isometric view of FIG. 23B along line A-A, of an embodiment of the device 200 according to aspects of the method of FIG. 1.

In the channel region 720, as illustrated in FIGS. 23C and 23D, the gate dielectric layer 1014 is disposed below the nanowire 316. In some embodiments, the gate dielectric layer 1014 wraps over each of the nanowire 316. However, in other embodiments, other portions of the HK/MG stack 1010 (e.g., gate electrode 1016) may also be disposed under the nanowire 316. The top nanowire 316A has a greater thickness than other nanowires 316. The top nanowire 316A has a greater thickness (diameter) than other nanowires 316.

Figure 23E:
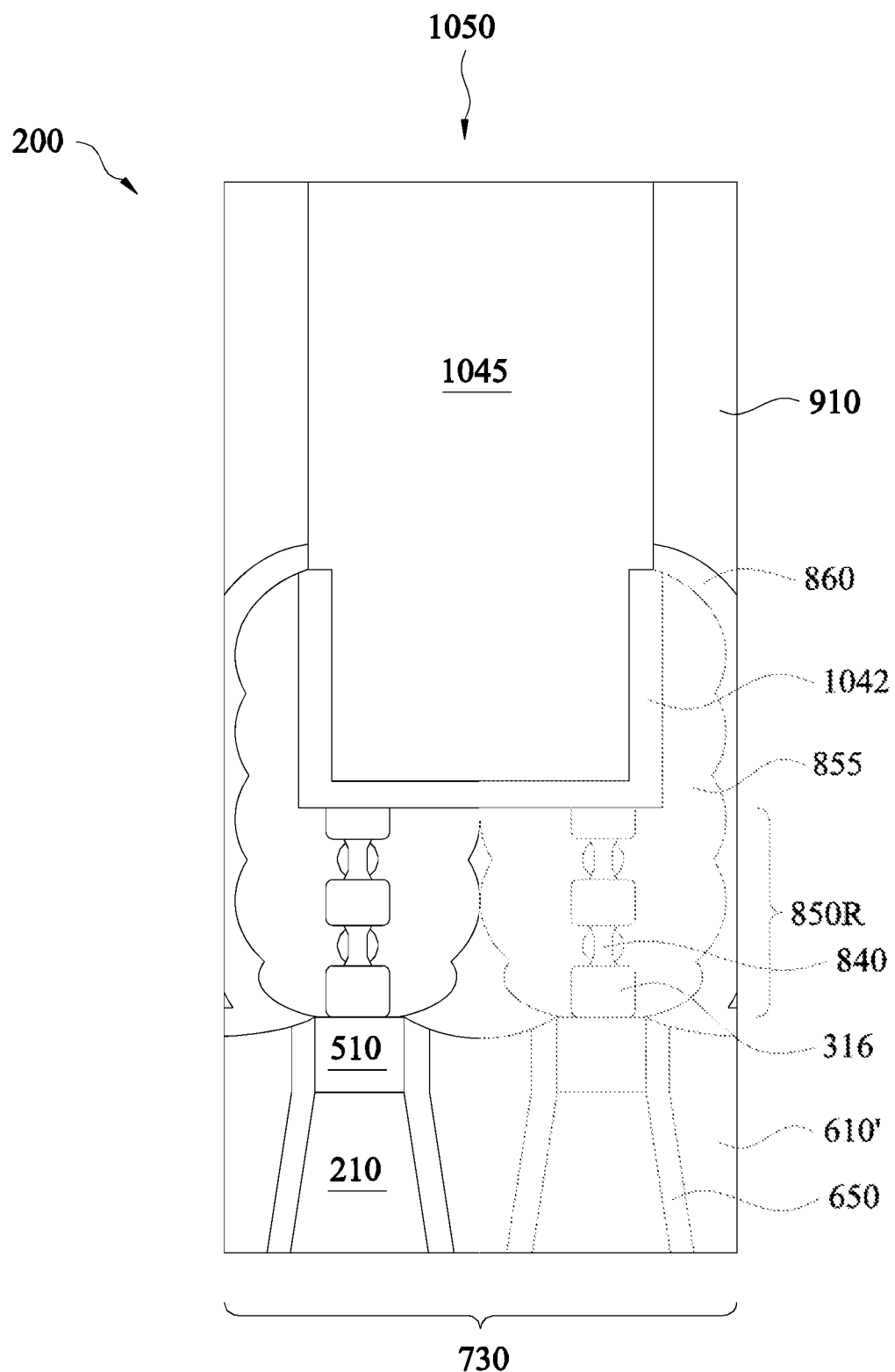
FIGS. 23E and 23H are cross-section views, corresponding to the isometric view of FIG. 23B along line B-B, of an embodiment of the device 200 according to aspects of the method of FIG. 1.

In the S/D region 730, the device 200 in FIGS. 23D and 23E illustrate the S/D feature 850R having the epitaxially cladding layer 855 disposed on multiple surfaces of the nanowire 316, while inner-spacer layer 840 is disposed between nanowires 316. The S/D feature 850R includes multiple nanowires and each of the nanowire 316 extends into the channel region 720, thereby forming a multi-channel, multi-S/D region structure. The S/D contact metal 1050 (with the silicide layer 1042) physically contacts with S/D features 850R. In some embodiments, the S/D contact metal 1050 (with the silicide layer 1042) contacts with multiple S/D features 850R. A lower portion of the S/D contact metal 1050 (with the silicide layer 1042) physically contacts with the epitaxially grown cladding layer 855 of the S/D feature 850R and an upper portion of the S/D contact metal 1050 physically contacts with the ILD layer 910. In some embodiments, a portion of the inner-spacer layer 840 separates the S/D contact metal 1050 (with the silicide layer 1042) from the gate dielectric layers 1012 and 1014.

Figure 23F:
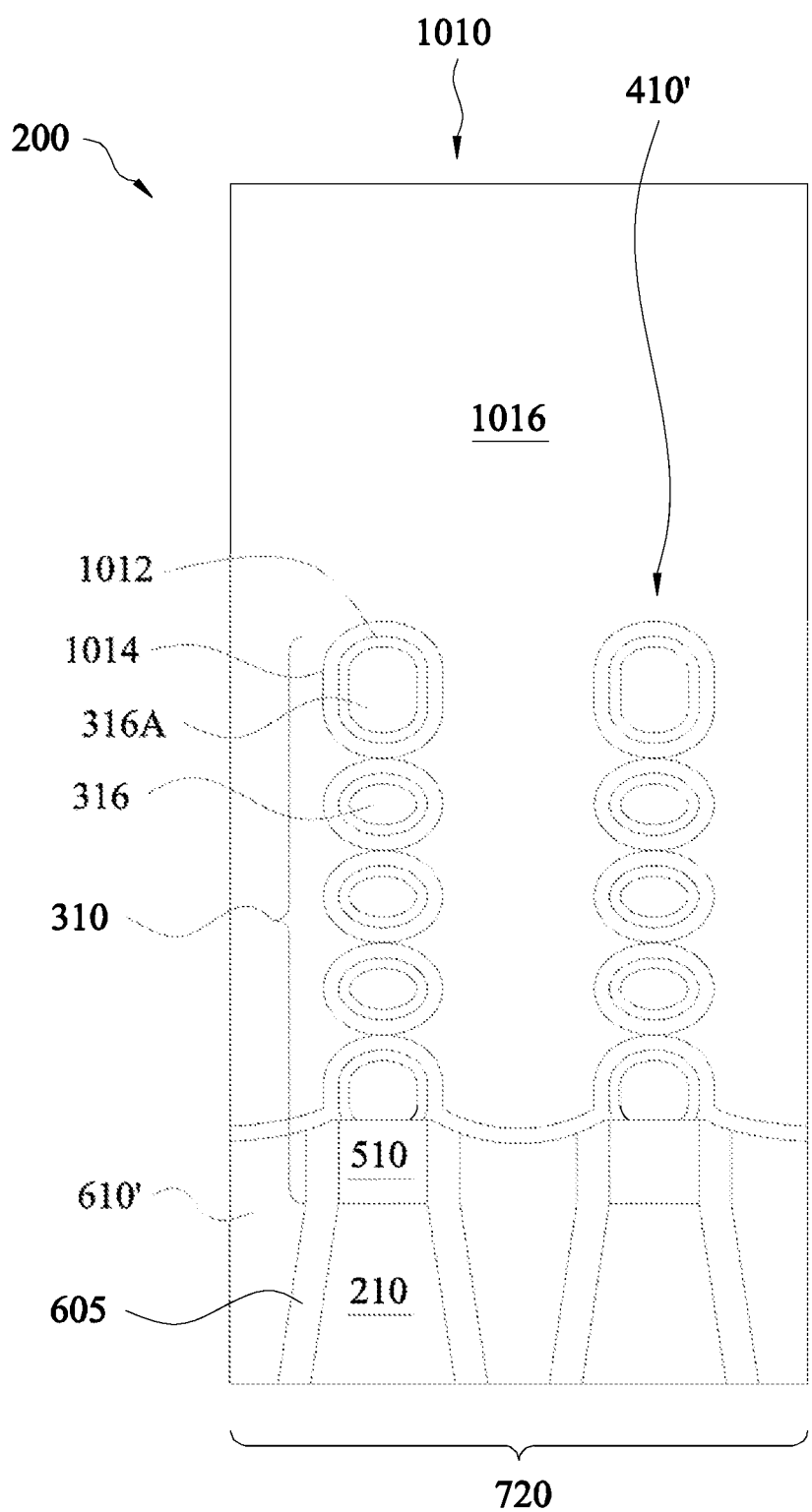
Figure 23G:
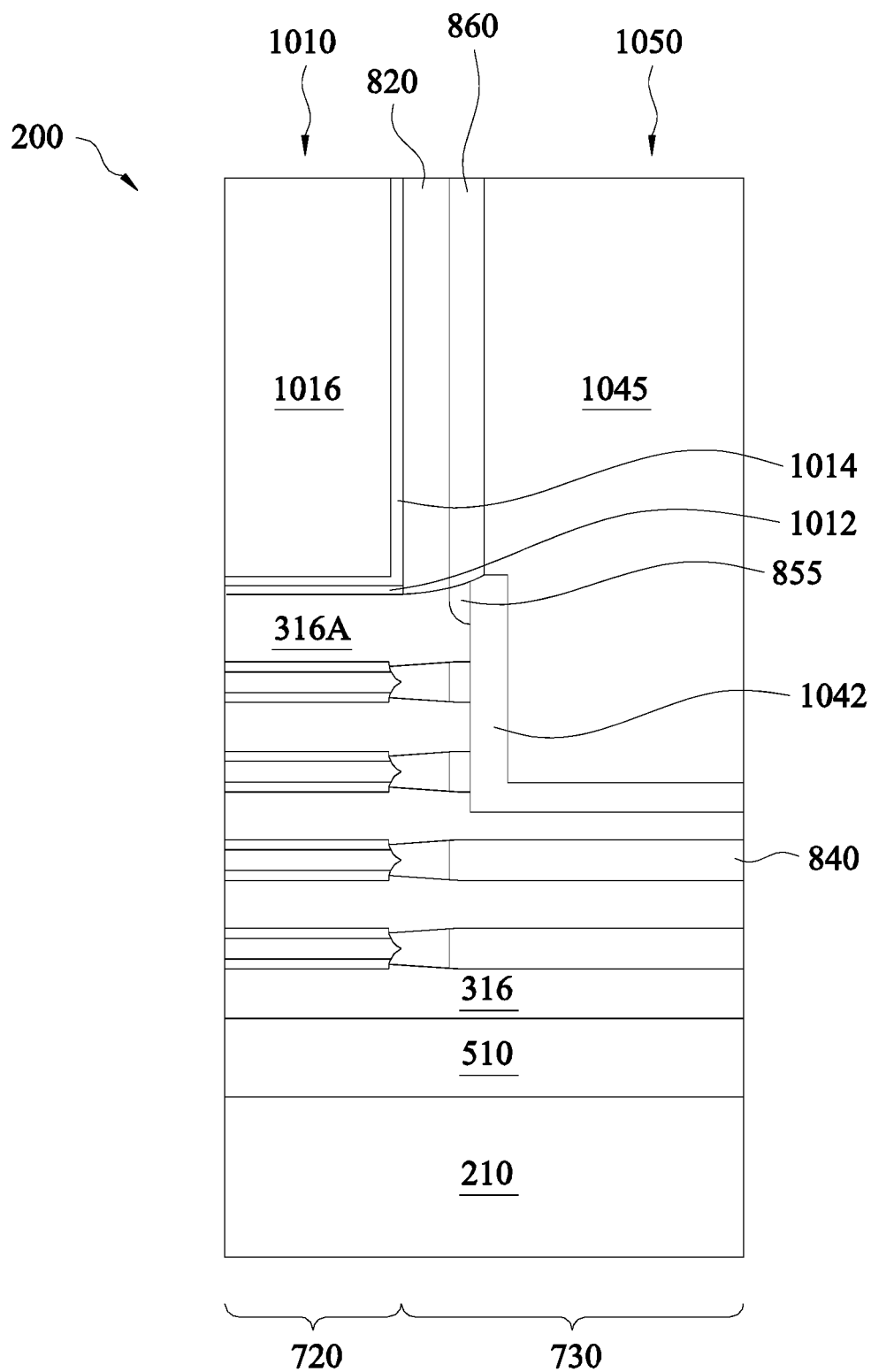
Figure 23H:
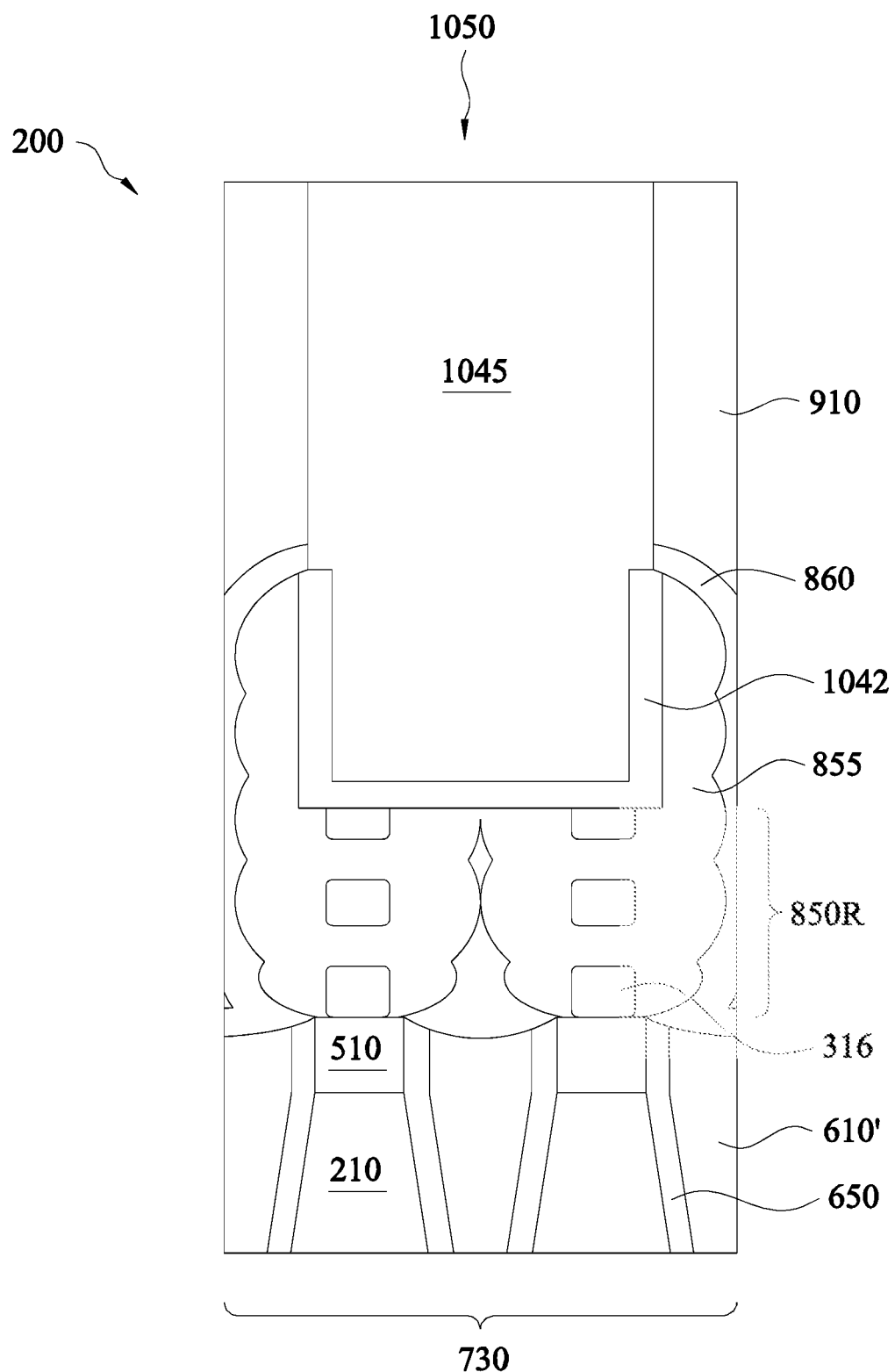

FIGS. 23F, 23G and 23H illustrate the device 200 in circumstances where the inner-spacer layer 840 is removed from the most portion of the S/D regions 730 but remains in the portions of the S/D regions 730 close to the channel region 720 (as shown in FIGS. 14D-14E). The S/D feature 850R has the epitaxially grown cladding layer 855 disposed on multiple surfaces of the nanowire 316, including wrapping over the second epitaxy layers 316.

Additional process steps may be implemented before, during, and after method 100, and some process steps described above may be replaced or eliminated in accordance with various embodiments of method 100.

Figure 24:
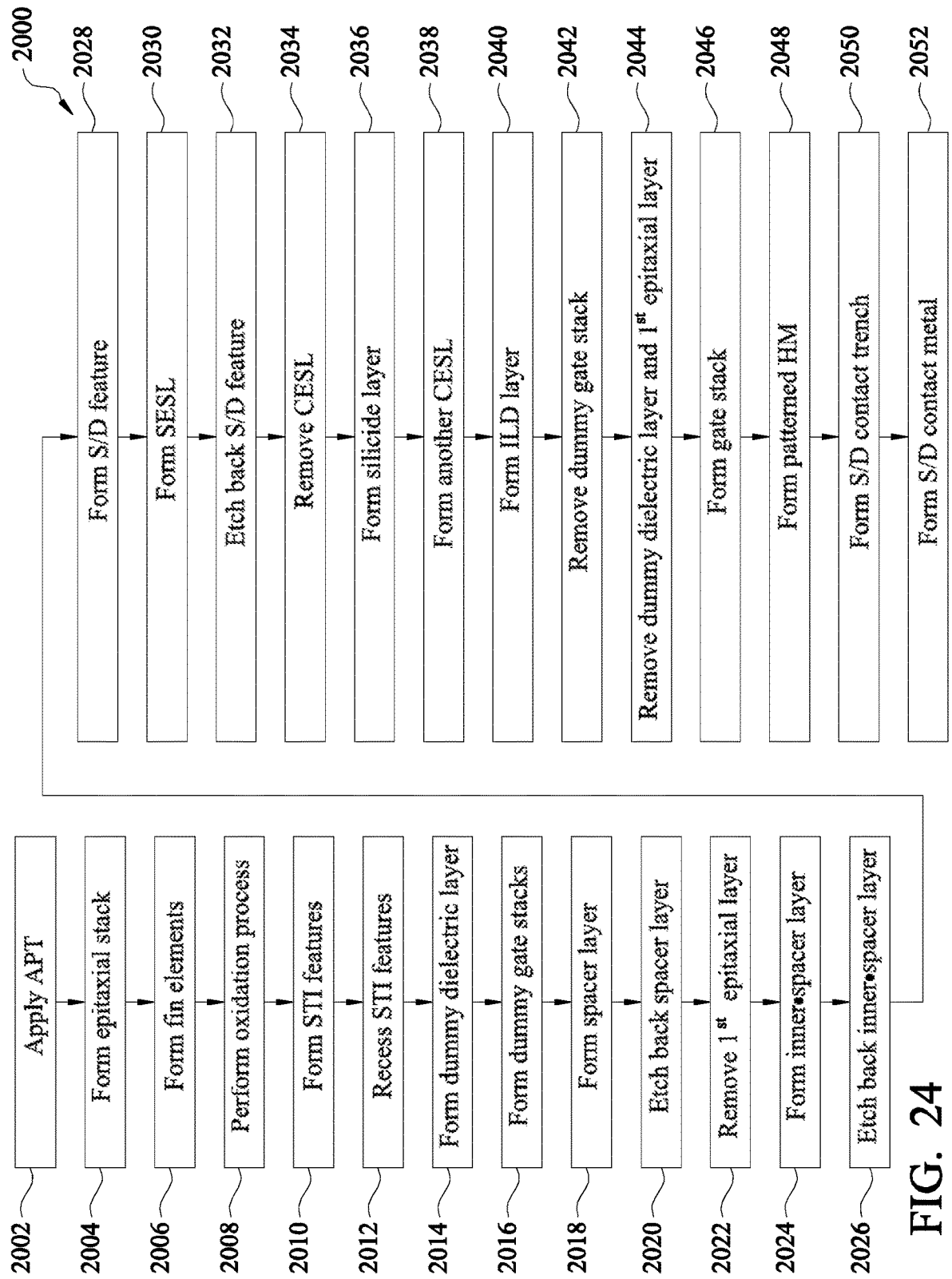
FIG. 24 is a flow chart of another method of fabricating a multi-gate device or portion thereof according to one or more aspects of the present disclosure.

Illustrated in FIG. 24 is a method 2000 of semiconductor fabrication including fabrication of the semiconductor device 3000. The steps 2002 through 2030 are similar to those discussed above in steps 102 through 130 of method 100, respectively. Thus, the discussions above with respect to steps 102 through 130 are applicable to the steps 2002 through 2030, respectively. The present disclosure repeats reference numerals and/or letters in the various embodiments. This repetition is for the purpose of simplicity and clarity such that repeated reference numerals and/or letters indicate similar features amongst the various embodiments unless stated otherwise.

Figure 25:
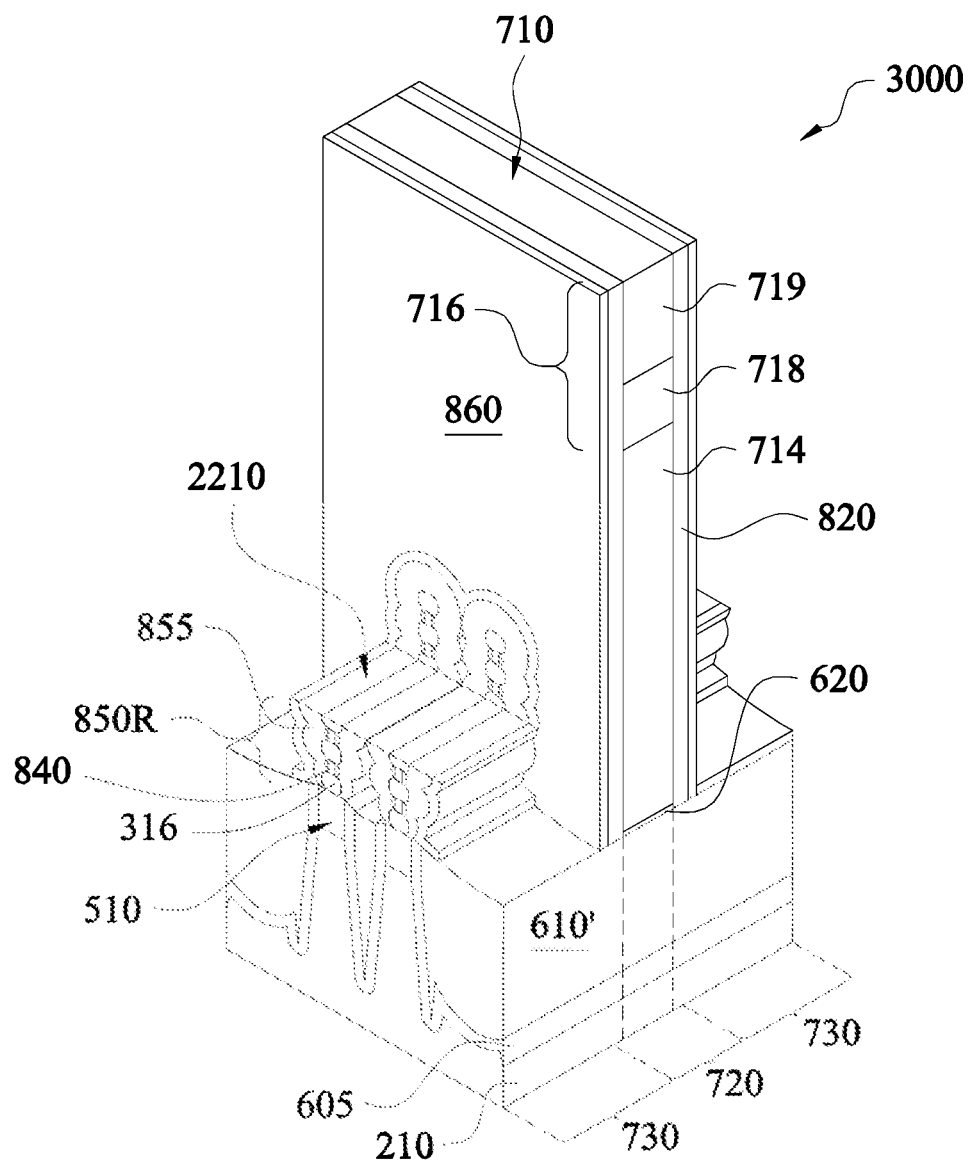
FIGS. 25, 26, 27, 28 and 29A are isometric views of an embodiment of a device 200 according to aspects of the method of FIG. 24.

Referring to FIGS. 24 and 25, after forming the S/D features 850, method 2000 proceeds to step 2032 by etching-back the S/D features 850 to form a common S/D mesa 2210. In some embodiments, the common S/D mesa 2210 is formed over multiple S/D features 850R and each of them includes multiple nanowires 316. The etch process may include wet etch, dry etch, and/or combinations thereof. As an example, a dry etching process may implement chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof.

Figure 26:
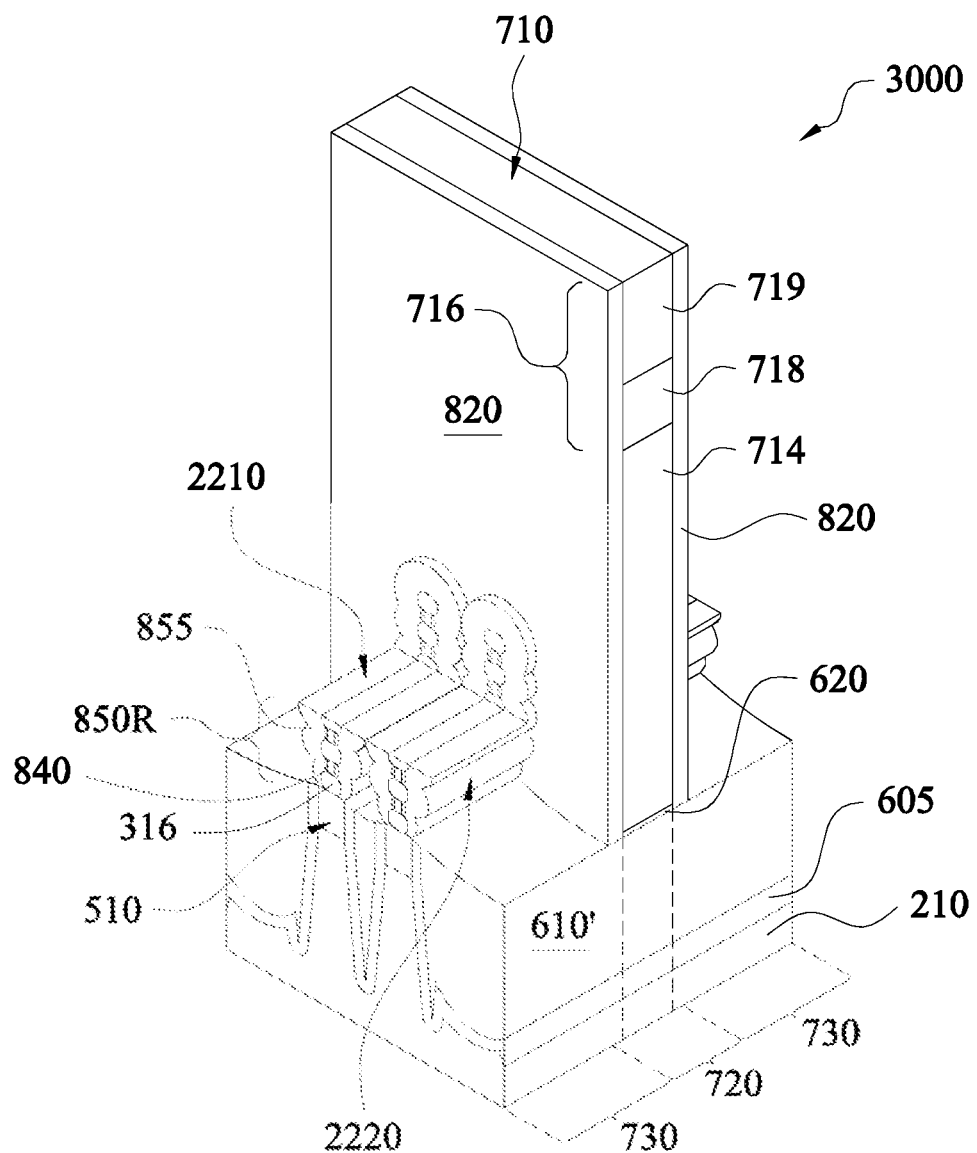

Referring to FIGS. 24 and 26, method 2000 proceeds to step 2034 by removing the CESL 860 to further expose sidewalls 2220 of the common S/D mesa 2210. The etch process may include wet etch, dry etch, and/or combinations thereof, In an embodiment, the CESL 860 is removed by a selective wet etch.

Figure 27:
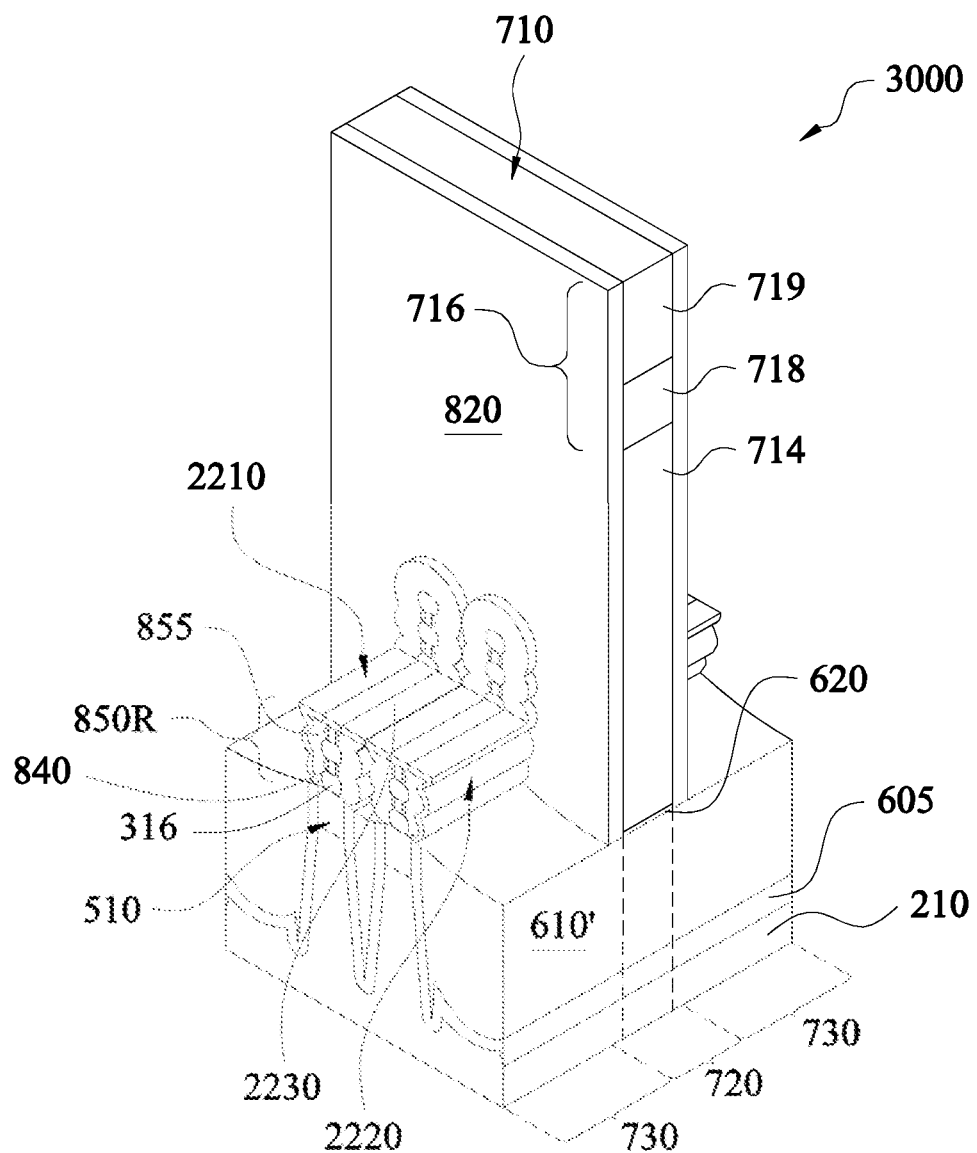

Referring to FIGS. 24 and 27, method 2000 proceeds to step 2036 by forming a silicide layer 2220 over the common S/D mesa 2210, including wrapping over the sidewalls 2220. Since the silicide layer 2220 is formed before forming a final gate stack, it is referred to as a silicide-first scheme. The silicide layer 2220 is formed similarly in many respects to the silicide layer 1042 discussed above association with FIGS. 23A, 23C and 23D, including the materials discussed therein.

Figure 28:
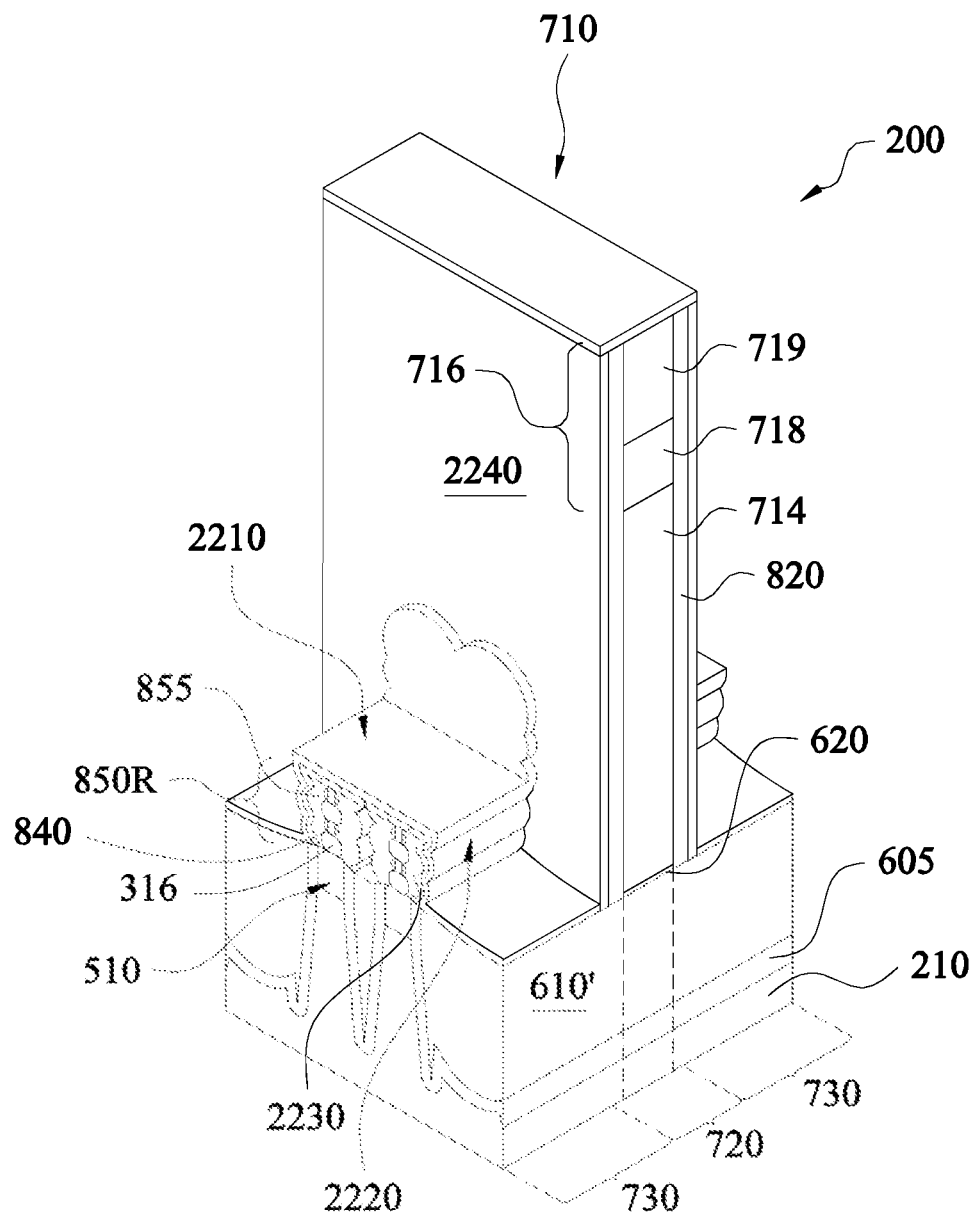

Referring to FIGS. 24 and 28, method 2000 proceeds to step 3238 forming another CESL 2240 over the substrate 210, including over the silicide layer 2220. The CESL 2240 is formed similarly in many respects to the CESL 860 discussed above association with FIG. 16, including the materials discussed therein.

The steps 2040 through 2052 are similar to those discussed above in steps 132 through 144 of method 100, respectively. Thus, the discussions above with respect to steps 132 through 144 are applicable to the steps 2040 through 2052, respectively, except there is no silicide layer deposition in step 2052. The present disclosure repeats reference numerals and/or letters in the various embodiments. This repetition is for the purpose of simplicity and clarity such that repeated reference numerals and/or letters indicate similar features amongst the various embodiments unless stated otherwise.

Referring to FIGS. 29A, 29B, 29C and 29D, the device 3000 may perform as a gate-all-around (GAA) device, the HK/MG stack 1010 being formed on multiple nanowires 316. The multi-gate device 3000 is illustrated in isometric view in FIG. 29A and corresponding cross-sectional views in FIG. 29B (cross-sectional along line BB-BB through the gate structures 1010), FIG. 29C (cross-sectional along line A-A), FIG. 29D (cross-sectional along line B-B through the S/D feature 850R).

Figure 29A:
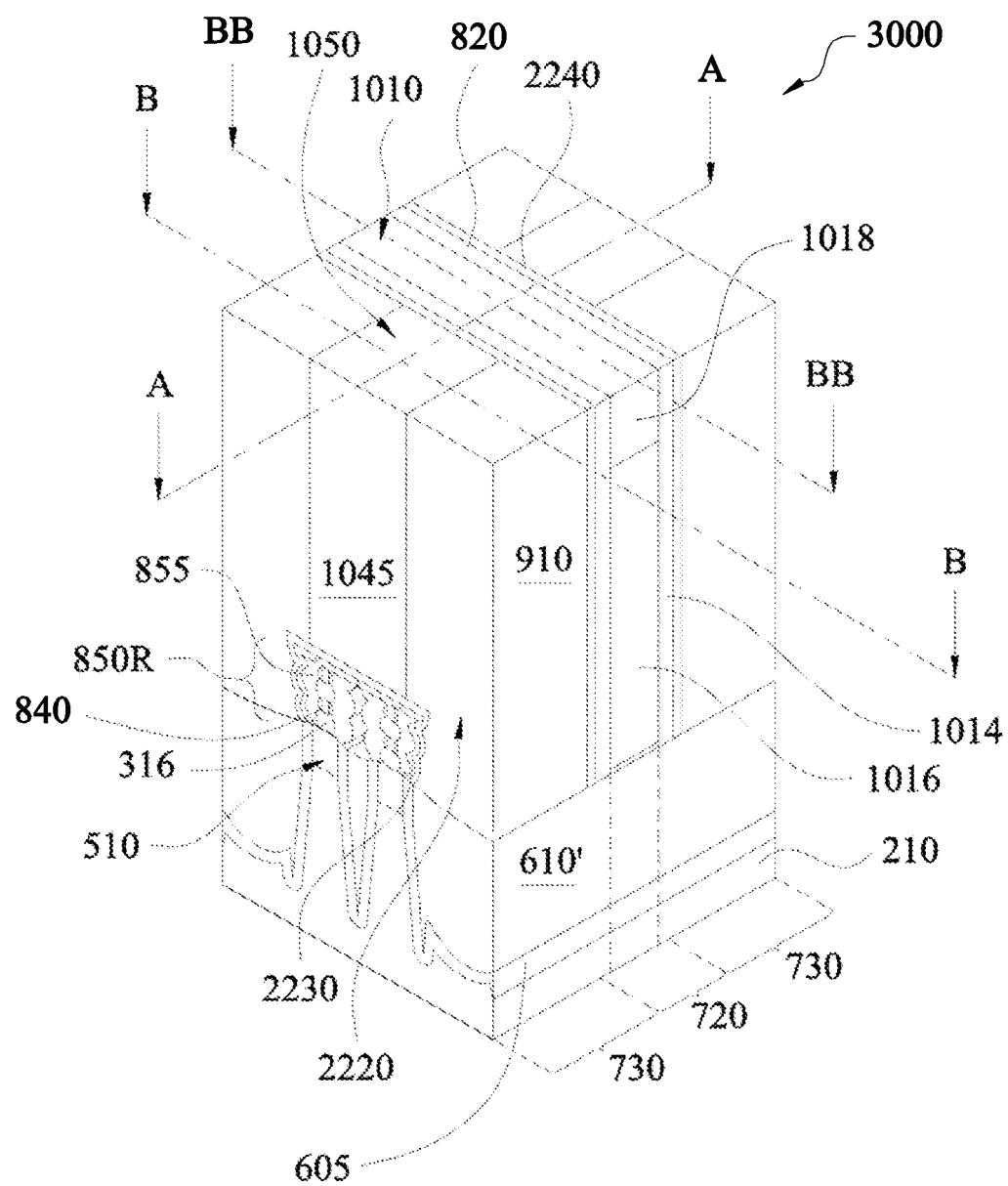
Figure 29B:
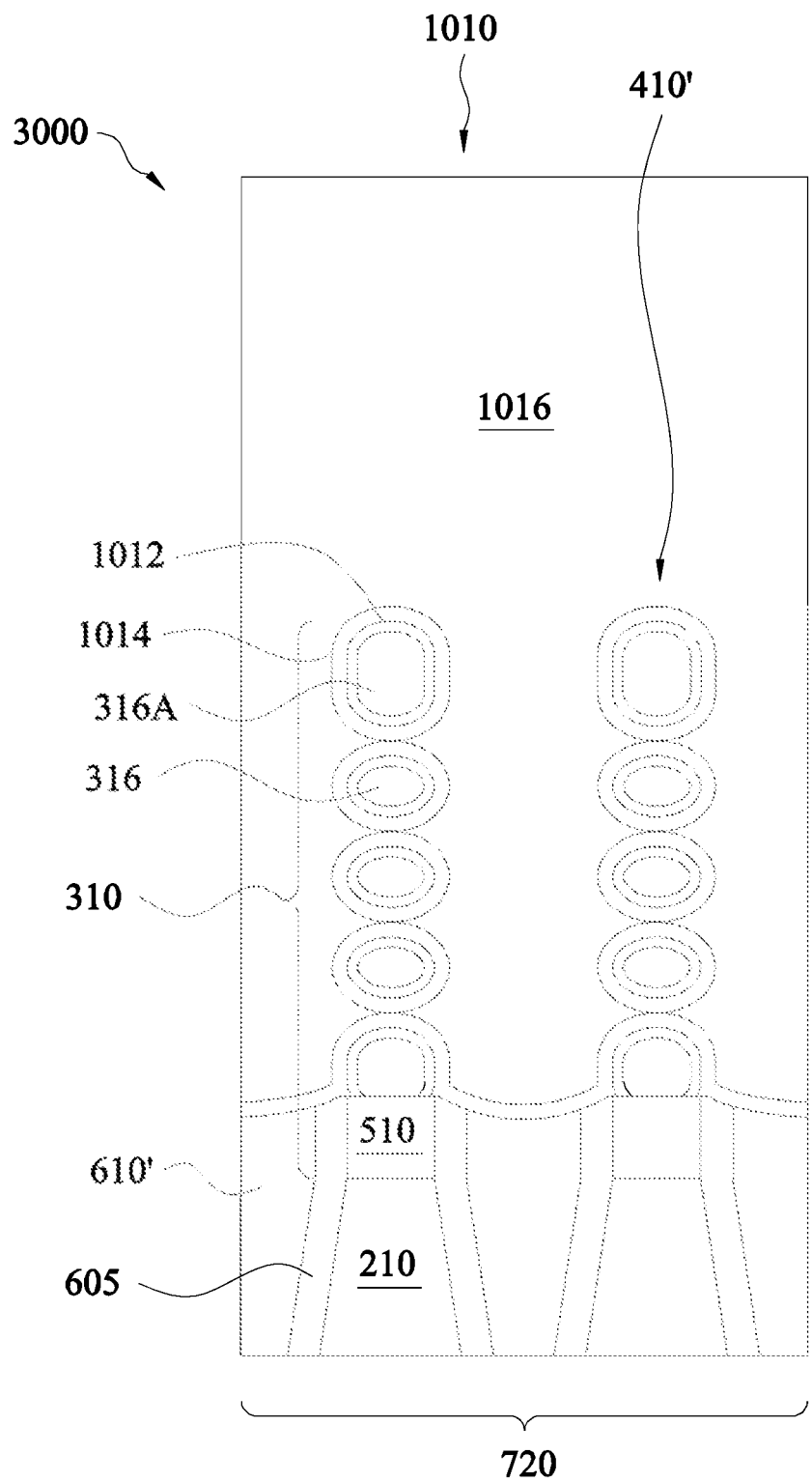
FIGS. 29B and 29E are cross-section views, corresponding to the isometric view of FIG. 29A along line BB-BB, of an embodiment of the device 200 according to aspects of the method of FIG. 24.
Figure 29C:
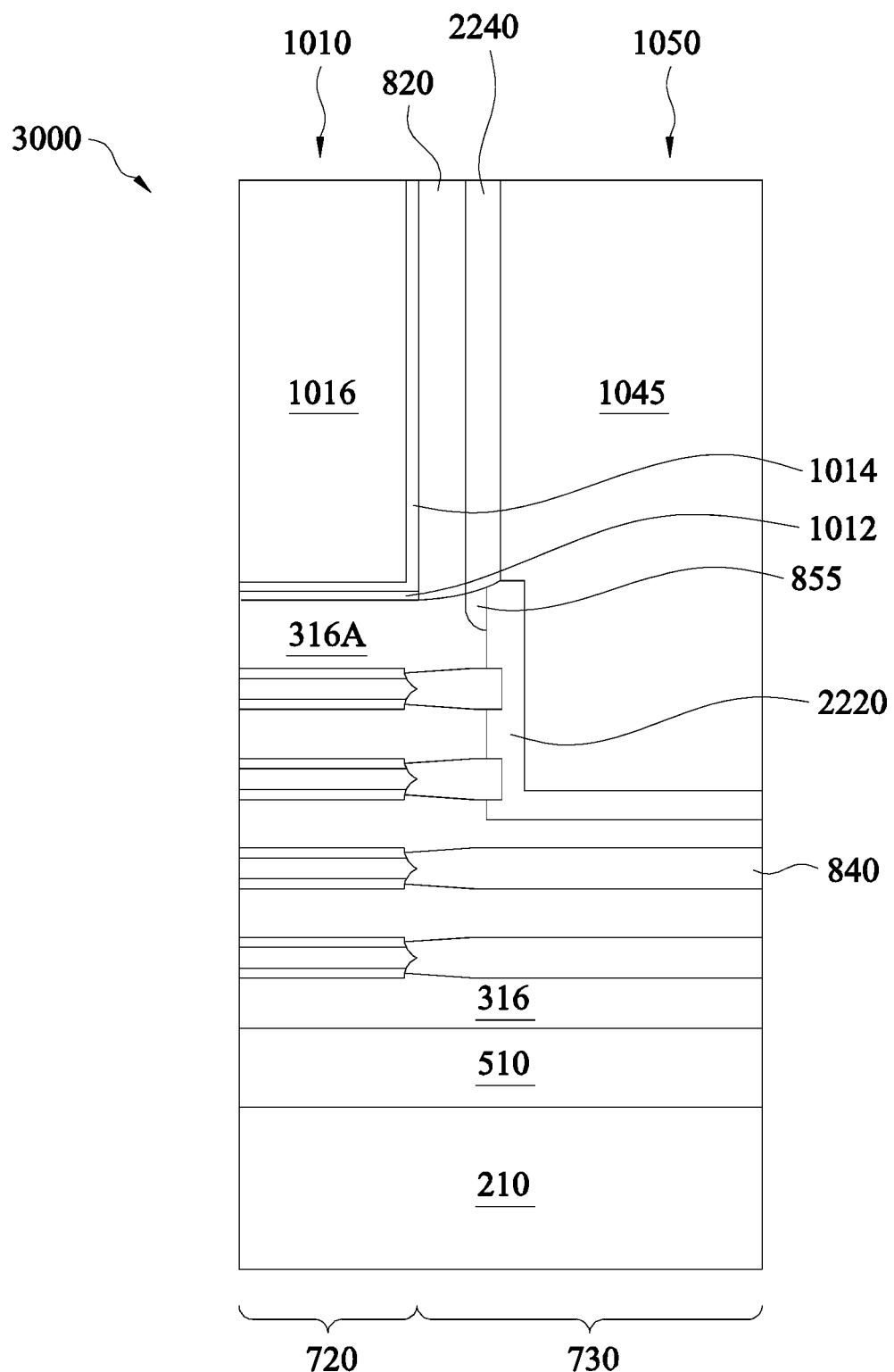
FIGS. 29C and 29F are cross-section views, corresponding to the isometric view of FIG. 29A along line A-A, of an embodiment of the device 200 according to aspects of the method of FIG. 24.

In the channel region 720, as illustrated in FIGS. 29B and 29C, the gate dielectric layer 1014 is disposed below the nanowire 316. In some embodiments, the gate dielectric layer 1014 wraps over each of the nanowire 316. However, in other embodiment, other portions of the HK/MG stack 1010 (e.g., gate electrode 1016) may also be disposed under the nanowire 316. The top nanowire 316A has a greater thickness than other nanowires 316. The top nanowire 316A has a greater thickness (diameter) than other nanowires 316.

Figure 29D:
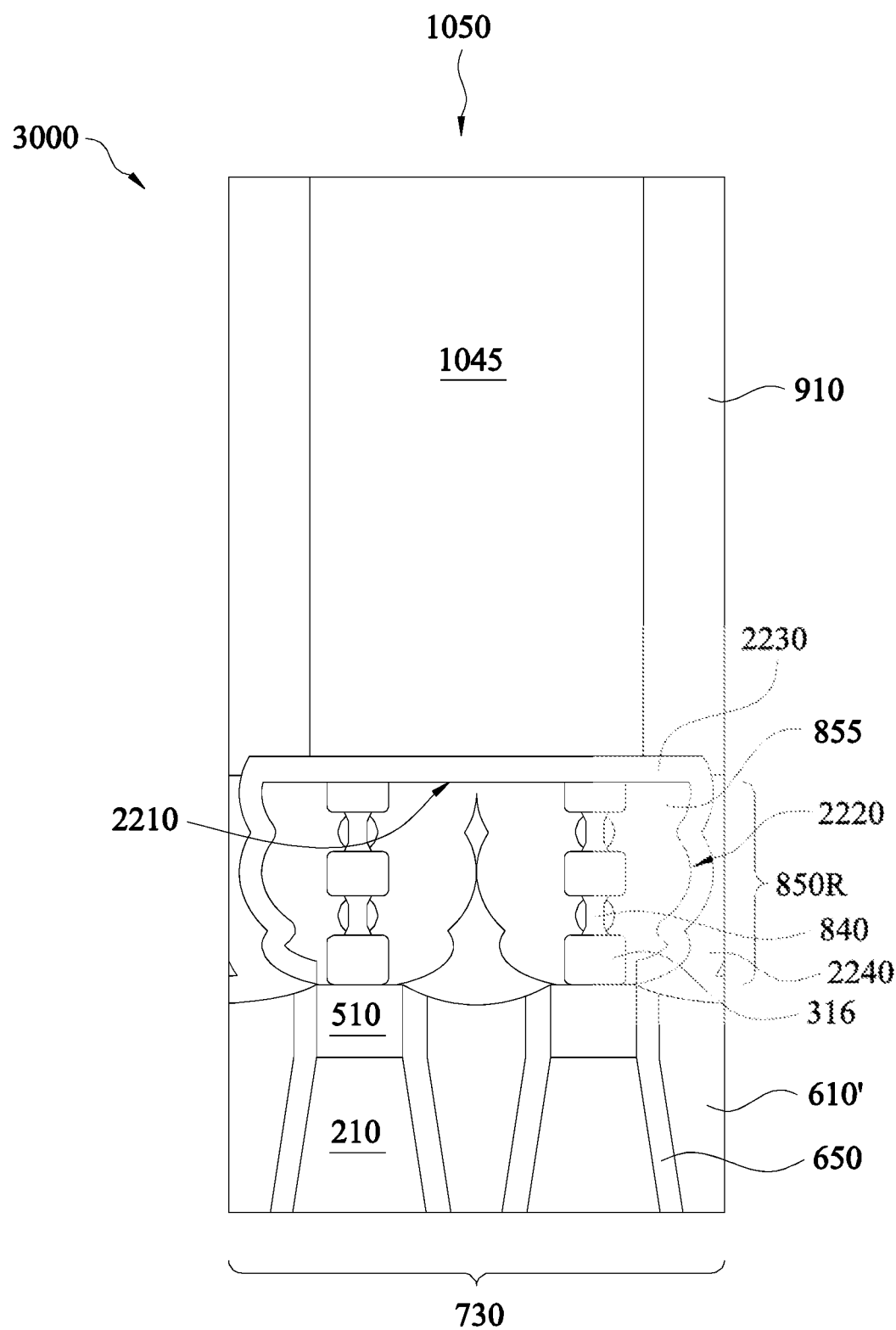
FIGS. 29D and 29G are cross-section views, corresponding to the isometric view of FIG. 29A along line B-B, of an embodiment of the device 200 according to aspects of the method of FIG. 24.

In the S/D region 730, the device 3000 in FIGS. 29C and 29D illustrate the S/D feature 850R having the epitaxially grown cladding layer 855 disposed on multiple surfaces of the nanowire 316, while inner-spacer layer 840 is disposed between nanowires 316. The S/D feature 850R includes multiple nanowires and each of the nanowire 316 extends into the channel region 720, thereby forming a multi-channel, multi-S/D region structure. In the silicide layer 2230 is disposed over the S/D feature 850R, including along sidewalls 2220 of the common S/D mesa 2210. A bottom of the S/D contact metal 1050 (with the silicide layer 1042) physically contacts with S/D features 850R. In some embodiments, the bottom of the S/D contact metal 1050 (with the silicide layer 1042) contacts with multiple S/D features 850R. Sidewalls of the S/D contact metal 1050 physically contacts with the ILD layer 910. In some embodiments, a portion of the inner-spacer layer 840 separates the S/D contact metal 1050 (with the silicide layer 1042) from the gate dielectric layers 1012 and 1014.

Figure 29E:
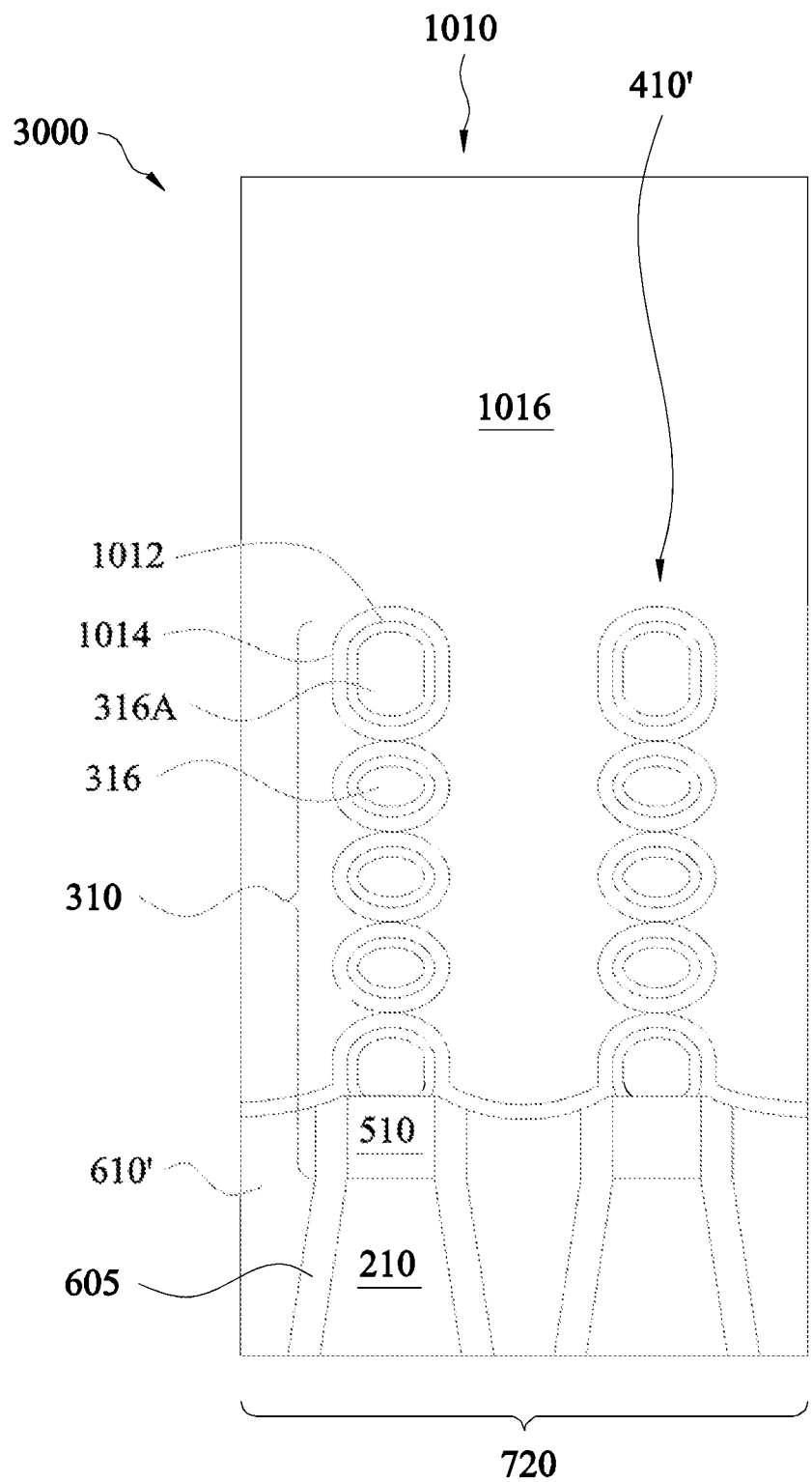
Figure 29F:
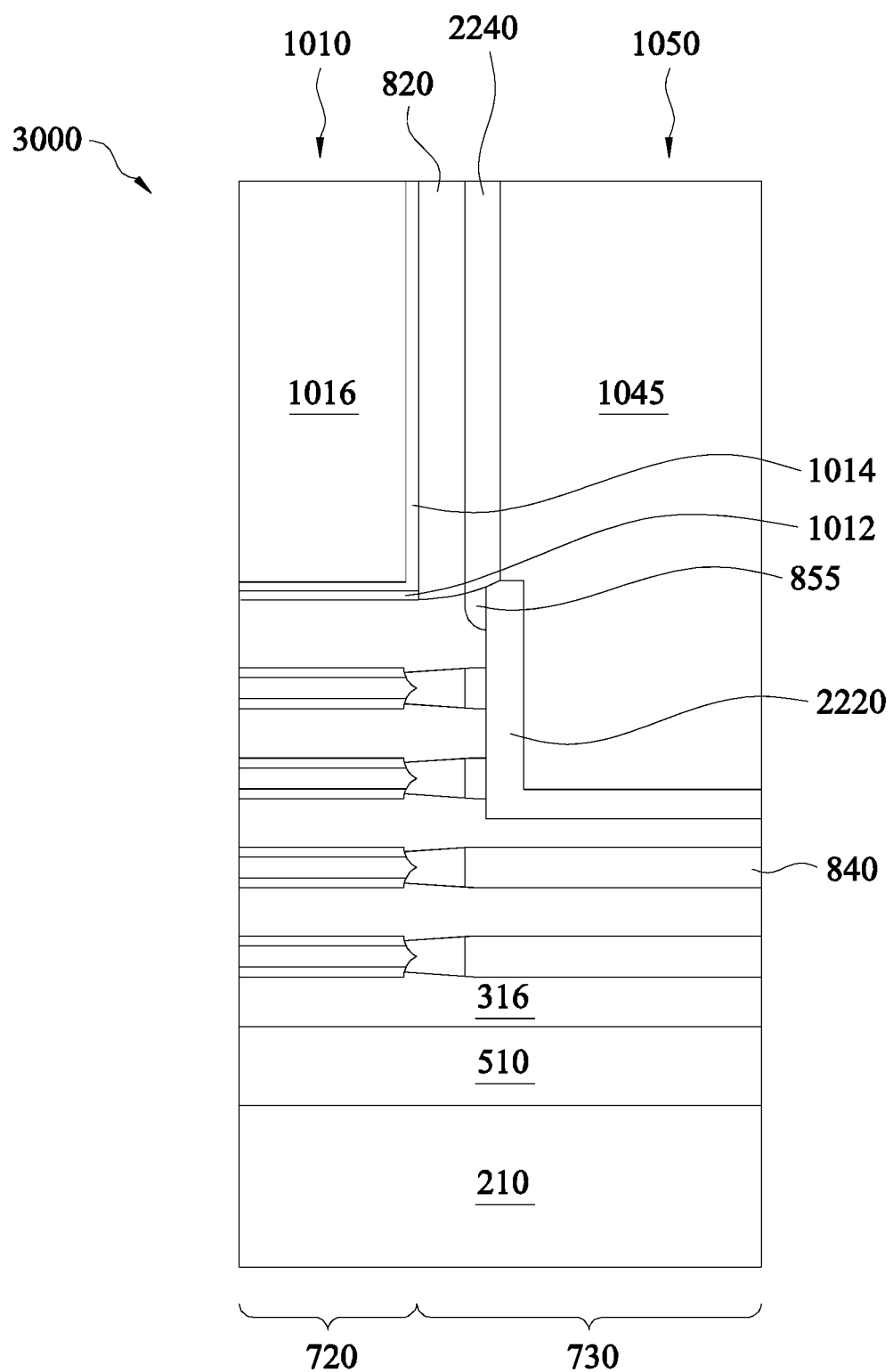
Figure 29G:
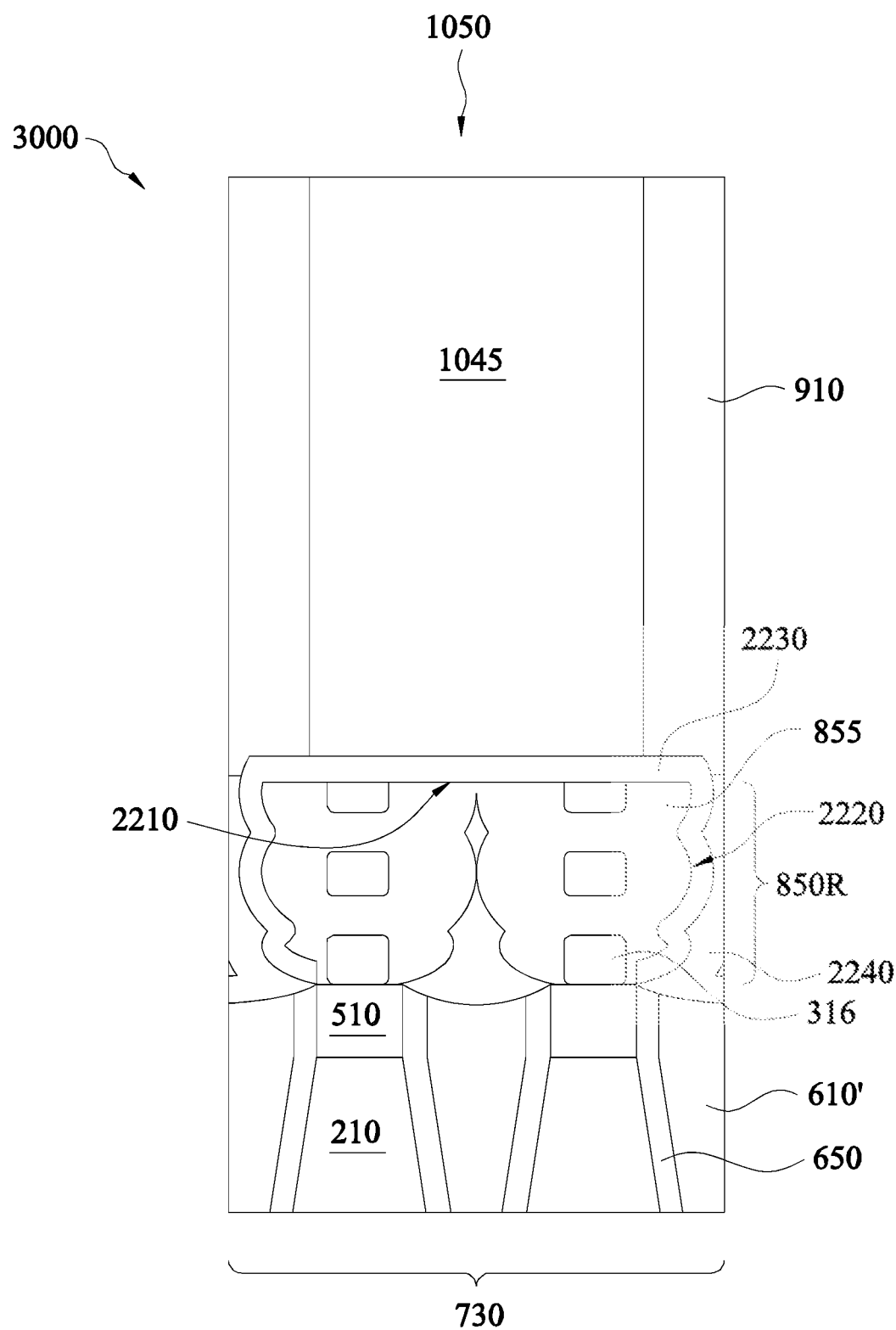

FIGS. 29E, 29F and 29G illustrate the device 3000 in circumstances where the inner-spacer layer 840 is removed from the most portion of the S/D regions 730 but remains in the portions of the S/D regions 730 close to the channel region 720 (as shown in FIGS. 14D-14E). The S/D feature 850R has the epitaxially grown cladding layer 855 disposed on multiple surfaces of the nanowire 316, including wrapping over the nanowires 316.

Additional process steps may be implemented before, during, and after method 2000, and some process steps described above may be replaced or eliminated in accordance with various embodiments of method 2000.

The semiconductor devices 200 and 3000 may undergo further CMOS or MOS technology processing to form various features and regions known in the art. For example, various contacts/vias and multilayers interconnect features (e.g., interlayer dielectrics) over the substrate 210, configured to connect the various features or structures of the semiconductor devices 200 and 3000.

Based on the above, it can be seen that the present disclosure provides devices and methods of forming devices such that a gate-all-around, multi-source/drain region structure. The device is equipped with wrap-around-silicide S/D contact with silicide first (forming silicide before forming final gate) and silicide last (forming silicide after forming final gate) schemes. The device is also equipped with wrap-around-silicide S/D contact over a stack of nanowires. The method provides a quite simple and feasible process integration.

The present disclosure provides many different embodiments of a semiconductor device, which includes a source/drain feature disposed over a substrate. The source/drain feature includes a first nanowire, a second nanowire disposed over the first nanowire, a cladding layer disposed over the first nanowire and the second nanowire and a spacer layer extending from the first nanowire to the second nanowire. The device also includes a conductive feature disposed directly on the source/drain feature such that the conductive feature physically contacts the cladding layer and the spacer layer.

In another embodiment, a device includes a gate feature disposed over a substrate. The gate feature includes a first nanowire, a second nanowire disposed over the first nanowire, a third nanowire disposed over the second nanowire and a gate dielectric layer surrounding the first, second and third nanowires. The device also includes a metal gate layer surrounding the gate dielectric layer including the first and second nanowires and a source/drain feature disposed over the substrate adjacent the gate feature. The source/drain feature includes the first nanowire, the second nanowire disposed over the first nanowire and a cladding layer disposed over the first nanowire and the second nanowire. The device also includes a conductive feature disposed directly on the source/drain feature such that the conductive feature physically contacts the cladding layer and the second nanowire.

In yet another embodiment, a method includes forming a first fin and a second fin over a substrate. The first fin and the second fin have a source/drain region. The first fin and the second fin are formed of a stack of first epitaxial layers. The method also includes growing a second epitaxial material on at least two surfaces of each of the first epitaxial layers of the first fin and the second fin to form a common source/drain feature in the source/drain region. The second epitaxial material extends from the first fin to the second fin. The method also includes recessing an upper portion of the common source/drain feature, including recessing an upper portion of the stack of the first epitaxial layers. The method also includes forming a silicide layer over the recessed source/drain feature and forming a source/drain metal over the silicide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first fin and a second fin over a substrate, wherein each of the first and second fins comprises first epitaxial layers of a first composition interposed by second epitaxial layers of a second composition different from the first composition, wherein the first and second fins include a source/drain region;
    removing the first epitaxial layers from the first and second fins in the source/drain region;
    forming an inner spacer layer between each two of the second epitaxial layers of the first and second fins in the source/drain region;
    growing a third epitaxial layer over and around the second epitaxial layers and the inner spacer layers of the first and second fins;
    recessing the third epitaxial layer to expose a top-facing surface of one second epitaxial layer of each of the first and second fins;

forming a silicide layer in direct contact with the third epitaxial layer and the exposed top-facing surfaces of the second epitaxial layers of the first and second fins; and forming a metal component in direct contact with the silicide layer.

2. The method of claim 1, wherein the recessing of the third epitaxial layer comprises removing at least one second epitaxial layer from the source/drain region of the first and second fins.

3. The method of claim 1, wherein the first epitaxial layers comprise silicon germanium and the second epitaxial layers comprise silicon.

4. The method of claim 1,
wherein the first and second fins include a channel region adjacent the source/drain region,
wherein the removing of the first epitaxial layers does not remove the first epitaxial layers in the channel region.

5. The method of claim 4, further comprising:
prior to the removing of the first epitaxial layers, forming a dummy gate stack over the channel region;
depositing a spacer layer over the dummy gate stack and the source/drain region; and
etching back the spacer layer to expose the source/drain region.

6. The method of claim 5, further comprising:
prior to the recessing of the third epitaxial layer, forming contact etch stop layer (CESL) and a dielectric layer over the third epitaxial layer.

7. The method of claim 6, further comprising:
prior to the recessing of the third epitaxial layer and after the forming of the CESL and the dielectric layer, removing the dummy gate stack;
after the removing of the dummy gate stack, removing the first epitaxial layers in the channel region; and
after the removing of the first epitaxial layers in the channel region, forming a metal gate stack around the second epitaxial layers in the channel region.

8. The method of claim 1, wherein the forming of the inner spacer layer comprises:
depositing an inner spacer material to wrap around each of the second epitaxial layers in the source/drain region; and
etching back the inner spacer material to leave the inner spacer layer to interpose between each two of the second epitaxial layers in the source/drain region.

9. The method of claim 1, wherein the inner spacer layer comprises silicon oxide or silicon nitride.

10. A method comprising:
forming a first fin and a second fin over a substrate, the first fin and the second fin having a source/drain region, the first fin and the second fin are formed of a stack of first epitaxial layers;
forming an epitaxial cladding layer over and around the first epitaxial layers of the first fin and the second fin to form a common source/drain feature in the source/drain region, wherein epitaxial cladding layer extends from the first fin to the second fin;
recessing an upper portion of the common source/drain feature, including recessing an upper portion of the stack of the first epitaxial layers;
forming a silicide layer over the recessed source/drain feature; and
forming a source/drain metal over the silicide layer.

11. The method of claim 10, further comprising:
prior to growing the epitaxial cladding layer, interposing an inner spacer layer between each two of the first epitaxial layers.

12. The method of claim 10, further comprising:
recessing a portion of the common source/drain feature, including recessing a portion of the stack of the first epitaxial layers, to form a common source/drain trench, wherein the common source/drain trench has the epitaxial cladding layer as its sidewalls;
forming the silicide layer over the common source/drain trench, including over the epitaxial cladding layer along sidewalls of the common source/drain trench; and
forming the source/drain metal in the common source/drain trench.

13. The method of claim 10, wherein the forming of the first fin and the second fin comprises:
forming a layer stack over the substrate, wherein the layer stack comprises the first epitaxial layers interleaved by second epitaxial layers;
patterning the layer stack to form the first fin and the second fin; and
selectively removing the second epitaxial layers.

14. The method of claim 13, wherein the selectively removing of the second epitaxial layers comprises:
selectively oxidizing the second epitaxial layers; and
selectively removing the oxidized second epitaxial layers.

15. The method of claim 13, wherein the selective removing of the second epitaxial layers comprises use of an ammonia hydroxide-hydrogen peroxide-water mixture.

16. The method of claim 13, wherein the first epitaxial layers comprise silicon and the second epitaxial layers comprise silicon germanium.

17. The method of claim 10,
wherein the epitaxial cladding layer comprises a semiconductor material and a dopant,
wherein the semiconductor material comprises Ge, Si, GaAs, AlGaAs, SiGe, GaAsP, or SiP,
wherein the dopant comprises boron, carbon, or phosphorus.

18. A method, comprising:
forming an epitaxial stack over a substrate, wherein the epitaxial stack comprises first epitaxial layers interleaved by second epitaxial layers;
patterning the epitaxial stack to form a first fin and a second fin, wherein the first and second fins include a channel region and a source/drain region adjacent the channel region;
depositing a capping layer over the first fin and the second fin;
depositing a dielectric layer over the capping layer;
recessing the capping layer and the dielectric layer to form a shallow trench isolation feature;
forming a dummy gate stack over the channel region;
removing the first epitaxial layers of the first fin and the second fin in the source/drain region;
forming an inner spacer layer between each two of the second epitaxial layers of the first and second fins in the source/drain region;
growing an epitaxial capping layer over and around the second epitaxial layers and the inner spacer layers of the first and second fins;
recessing the epitaxial capping layer to expose a top-facing surface of one second epitaxial layer of each of the first and second fins;

forming a silicide layer in direct contact with the epitaxial capping layer and the exposed top-facing surfaces of the second epitaxial layers of the first and second fins; and forming a metal component in direct contact with the silicide layer.

19. The method of claim 18, wherein the capping layer comprises silicon nitride or silicon carbide.

20. The method of claim 18, wherein the silicide layer comprises nickel silicide, cobalt silicide, tungsten silicide, tantalum silicide, titanium silicide, platinum silicide, erbium silicide, or palladium silicide.

* * * * *